(12) United States Patent
Chaware et al.

(10) Patent No.: US 10,466,298 B2
(45) Date of Patent: Nov. 5, 2019

(54) MAGNETIC FIELD SENSOR WITH SHARED PATH AMPLIFIER AND ANALOG-TO-DIGITAL-CONVERTER

(71) Applicant: Allegro MicroSystems, LLC, Manchester, NH (US)

(72) Inventors: Virag V. Chaware, Nashua, NH (US); Aaron Cook, Deerfield, NH (US); Craig S. Petrie, Merrimack, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 168 days.

(21) Appl. No.: 15/710,136

(22) Filed: Sep. 20, 2017

(65) Prior Publication Data

US 2018/0011140 A1    Jan. 11, 2018

Related U.S. Application Data

(63) Continuation-in-part of application No. 14/541,735, filed on Nov. 14, 2014, now Pat. No. 9,841,485, and
(Continued)

(51) Int. Cl.
*G01R 27/26* (2006.01)
*G01R 31/28* (2006.01)
(Continued)

(52) U.S. Cl.
CPC ......... *G01R 31/2884* (2013.01); *G01D 5/145* (2013.01); *G01D 5/2448* (2013.01);
(Continued)

(58) Field of Classification Search
CPC ............. B60K 37/06; B60K 2350/928; B60K 2350/1024; B60K 2350/1028;
(Continued)

(56) References Cited

U.S. PATENT DOCUMENTS 3,778,794 A * 12/1973 Szabo .................. G01R 21/133
360/32
4,236,832 A    12/1980 Komatsu et al.
(Continued)

FOREIGN PATENT DOCUMENTS

CN            1501093 A      6/2004
CN         200986484 Y      12/2007
(Continued)

OTHER PUBLICATIONS

312 Amendment filed Feb. 11, 2014; for U.S. Appl. No. 13/743,451; 7 pages.
(Continued)

*Primary Examiner* — Alesa Allgood
(74) *Attorney, Agent, or Firm* — Daly, Crowley, Mofford & Durkee, LLP

(57) ABSTRACT

A magnetic field sensor comprises at least one magnetic field sensing element configured to generate a measured magnetic field signal responsive to an external magnetic field; a diagnostic circuit configured to generate a diagnostic signal, wherein the diagnostic signal is not dependent on a measured magnetic field; a signal path comprising an amplifier and an analog-to-digital converter for processing the measured magnetic field signal to generate a sensor output signal indicative of the external magnetic field during a measured time period and for processing the diagnostic signal during a diagnostic time period; and a switch coupled to receive the measured magnetic field signal and the diagnostic signal and direct the measured magnetic field signal to the signal path during the measured time period and direct the diagnostic signal to the signal path during the diagnostic time period.

12 Claims, 15 Drawing Sheets

Related U.S. Application Data a continuation-in-part of application No. 14/541,582, filed on Nov. 14, 2014, now Pat. No. 9,804,222, and a continuation-in-part of application No. 14/541,454, filed on Nov. 14, 2014, now Pat. No. 9,804,249.

(51) Int. Cl.
| | |
|---|---|
| *G01R 33/09* | (2006.01) |
| *G01R 33/07* | (2006.01) |
| *G01R 33/00* | (2006.01) |
| *G01D 5/14* | (2006.01) |
| *G01D 5/244* | (2006.01) |
| *G01R 35/00* | (2006.01) |
| *G01R 15/20* | (2006.01) |

(52) U.S. Cl.
CPC ....... *G01D 5/2449* (2013.01); *G01R 33/0035* (2013.01); *G01R 33/0041* (2013.01); *G01R 33/07* (2013.01); *G01R 33/09* (2013.01); *G01R 35/00* (2013.01); *G01R 15/20* (2013.01); *G01R 31/2829* (2013.01)

(58) Field of Classification Search
CPC .... B60K 2350/1032; B60K 2350/1036; B60K 28/04; G06F 3/044; B60R 2011/001; B60W 10/20; G01D 5/24
See application file for complete search history.

(56) References Cited

U.S. PATENT DOCUMENTS

| | | | |
|---|---|---|---|
| 4,438,347 A | 3/1984 | Gehring | |
| 4,752,733 A | 6/1988 | Petr et al. | |
| 4,758,943 A | 7/1988 | Aström et al. | |
| 4,760,285 A | 7/1988 | Nelson | |
| 4,823,075 A | 4/1989 | Alley | |
| 4,833,406 A | 5/1989 | Foster | |
| 4,970,411 A | 11/1990 | Halg et al. | |
| 5,247,278 A | 9/1993 | Pant et al. | |
| 5,329,416 A | 7/1994 | Ushiyama et al. | |
| 5,343,143 A | 8/1994 | Voisine et al. | |
| 5,412,255 A | 5/1995 | Wallrafen | |
| 5,424,558 A | 6/1995 | Borden et al. | |
| 5,469,058 A | 11/1995 | Dunnam | |
| 5,521,501 A | 5/1996 | Dettmann et al. | |
| 5,621,319 A | 4/1997 | Bilotti et al. | |
| 5,640,090 A | 6/1997 | Furuya et al. | |
| 5,844,140 A | 12/1998 | Seale | |
| 6,011,770 A | 1/2000 | Tan | |
| 6,351,506 B1 | 2/2002 | Lewicki | |
| 6,392,478 B1 | 5/2002 | Mulder et al. | |
| 6,436,748 B1 | 8/2002 | Forbes et al. | |
| 6,437,558 B2 | 8/2002 | Li et al. | |
| 6,687,644 B1 | 2/2004 | Zinke et al. | |
| 6,750,644 B1 | 6/2004 | Berkcan | |
| 6,853,178 B2 | 2/2005 | Hayat-Dawoodi | |
| 6,896,407 B2 | 5/2005 | Nomiyama et al. | |
| 6,917,321 B1 | 7/2005 | Haurie et al. | |
| 7,038,448 B2 | 5/2006 | Schott et al. | |
| 7,190,784 B2 | 3/2007 | Li | |
| 7,259,545 B2 | 8/2007 | Stauth et al. | |
| 7,292,095 B2 | 11/2007 | Burt et al. | |
| 7,319,319 B2 | 1/2008 | Jones et al. | |
| 7,323,870 B2 | 1/2008 | Tatschl et al. | |
| 7,325,175 B2 | 1/2008 | Momtaz | |
| 7,345,470 B2 | 3/2008 | Suzuki | |
| 7,425,821 B2 | 9/2008 | Monreal et al. | |
| 7,474,093 B2 | 1/2009 | Ausserlechner | |
| 7,518,354 B2 | 4/2009 | Stauth et al. | |
| 7,605,647 B1 | 10/2009 | Romero et al. | |
| 7,635,993 B2 | 12/2009 | Boeve | |
| 7,694,200 B2 | 4/2010 | Forrest et al. | |
| 7,701,208 B2 | 4/2010 | Nishikawa | |
| 7,729,675 B2 | 6/2010 | Krone | |
| 7,746,056 B2 | 6/2010 | Stauth et al. | |
| 7,746,065 B2 | 6/2010 | Pastre et al. | |
| 7,764,118 B2 | 7/2010 | Kusuda et al. | |
| 7,769,110 B2 | 8/2010 | Momtaz | |
| 7,800,389 B2 | 9/2010 | Friedrich et al. | |
| 7,923,996 B2 | 4/2011 | Doogue et al. | |
| 7,936,144 B2 | 5/2011 | Vig et al. | |
| 7,961,823 B2 | 6/2011 | Kolze et al. | |
| 7,982,454 B2 | 7/2011 | Fernandez et al. | |
| 7,990,209 B2 | 8/2011 | Romero | |
| 8,030,918 B2 | 10/2011 | Doogue et al. | |
| 8,128,549 B2 | 3/2012 | Testani et al. | |
| 8,134,358 B2 | 3/2012 | Charlier et al. | |
| 8,203,329 B2 | 6/2012 | Hohe et al. | |
| 8,299,783 B2 | 10/2012 | Fernandez et al. | |
| 8,447,556 B2 | 5/2013 | Friedrich et al. | |
| 8,542,010 B2 | 9/2013 | Cesaretti et al. | |
| 8,680,846 B2 | 3/2014 | Cesaretti et al. | |
| 8,680,848 B2 | 3/2014 | Foletto et al. | |
| 8,692,546 B2 | 4/2014 | Cesaretti et al. | |
| 8,818,749 B2 | 8/2014 | Friedrich et al. | |
| 8,860,410 B2 | 10/2014 | Petrie | |
| 8,890,518 B2 | 11/2014 | Daubert | |
| 9,201,122 B2 | 12/2015 | Cesaretti et al. | |
| 9,645,220 B2 | 5/2017 | Cesaretti et al. | |
| 9,735,773 B2 | 8/2017 | McIntosh et al. | |
| 9,804,222 B2 | 10/2017 | Petrie et al. | |
| 9,804,249 B2 | 10/2017 | Petrie et al. | |
| 2001/0046348 A1 | 11/2001 | Sarkimukka et al. | |
| 2002/0084923 A1 | 7/2002 | Li | |
| 2003/0038675 A1 | 2/2003 | Gailus et al. | |
| 2003/0102909 A1 | 6/2003 | Motz | |
| 2006/0202692 A1 | 9/2006 | Tatschl et al. | |
| 2006/0253746 A1 | 11/2006 | Momtaz | |
| 2007/0110199 A1 | 5/2007 | Momtaz et al. | |
| 2007/0247141 A1* | 10/2007 | Pastre ................. | G01R 33/0035 324/202 |
| 2007/0285089 A1 | 12/2007 | Ibuki et al. | |
| 2008/0110987 A1 | 5/2008 | Cato et al. | |
| 2008/0137784 A1 | 6/2008 | Krone | |
| 2008/0238410 A1 | 10/2008 | Charlier et al. | |
| 2009/0001964 A1 | 1/2009 | Strzalkowski | |
| 2009/0085706 A1 | 4/2009 | Baarman et al. | |
| 2010/0141275 A1 | 6/2010 | Matsushima | |
| 2010/0211347 A1* | 8/2010 | Friedrich ........... | G01R 33/0023 702/117 |
| 2010/0321105 A1 | 12/2010 | Romero | |
| 2011/0074405 A1 | 3/2011 | Doogue et al. | |
| 2012/0299588 A1 | 11/2012 | Petrie | |
| 2013/0093412 A1 | 4/2013 | Anelli et al. | |
| 2013/0134872 A1* | 5/2013 | Lidstrom ............... | H05B 6/685 315/39.51 |
| 2013/0214774 A1 | 8/2013 | Cesaretti et al. | |
| 2013/0335069 A1* | 12/2013 | Vig .................... | G01R 33/0035 324/207.12 |
| 2014/0266176 A1 | 9/2014 | Fernandez et al. | |
| 2016/0139199 A1 | 5/2016 | Petrie et al. | |
| 2016/0139229 A1 | 5/2016 | Petrie et al. | |

FOREIGN PATENT DOCUMENTS

| | | |
|---|---|---|
| DE | 195 39 458 A1 | 4/1997 |
| DE | 10 2006 037 226 A1 | 2/2008 |
| DE | 10 2007 041 230 B3 | 4/2009 |
| EP | 0 289 414 A2 | 11/1988 |
| EP | 0 289 414 A3 | 11/1988 |
| EP | 0 357 013 A2 | 3/1990 |
| EP | 0 357 013 A3 | 3/1990 |
| EP | 0 944 888 A2 | 9/1999 |
| EP | 1637898 A1 | 3/2006 |
| EP | 1 679 524 A1 | 7/2006 |
| EP | 1 850 143 A1 | 10/2007 |
| GB | 2 276 727 A | 10/1994 |
| JP | H03-248611 A | 11/1991 |
| JP | 2000-055999 A | 2/2000 |
| JP | 2002-213992 A | 7/2002 |
| JP | 2004-234589 A | 8/2004 |
| JP | 2006-126012 A | 5/2006 |

(56) References Cited

FOREIGN PATENT DOCUMENTS

| | | |
|---|---|---|
| JP | 2010152876 A | 7/2010 |
| JP | 2014-517919 A | 7/2014 |
| KR | 10-2007-0060096 A | 6/2007 |
| WO | WO 96/02849 A1 | 2/1996 |
| WO | WO 2004/072672 A1 | 8/2004 |
| WO | WO 2006/035342 A1 | 4/2006 |
| WO | WO 2006/056829 A1 | 6/2006 |
| WO | WO 2007/138508 A1 | 12/2007 |
| WO | WO 2008/048379 A1 | 4/2008 |
| WO | WO 2009/108422 A2 | 9/2009 |
| WO | WO 2009/108422 A3 | 9/2009 |
| WO | WO 2010/096367 A1 | 8/2010 |
| WO | WO 2011/011479 A1 | 1/2011 |
| WO | WO 2012/050711 A1 | 4/2012 |
| WO | WO 2012/148646 A1 | 11/2012 |

OTHER PUBLICATIONS

German Office Action (with English translation); dated Sep. 23, 2013; for German Pat. App. No. 11 2010 000 848.5; 12 pages.
Letter to Kuhnen & Wacker dated Jan. 20, 2014, with enclosures; for DE Pat. App. No. 112010000848.5; 14 pages.
Letter to Kuhnen and Wacker dated May 8, 2014; for German Pat. App. No. 112010000848.5; 2 pages.
Notice of Allowance dated Dec. 10, 2012 for U.S. Appl. No. 12/706,318; 9 pages.
Notice of Allowance dated Dec. 24, 2013; U.S. Appl. No. 13/743,451; 24 pages.
Office Action dated Jul. 6, 2012; for U.S. Appl. No. 12/706,318; 29 pages.
Office Action dated Jun. 12, 2013; for U.S. Appl. No. 13/743,451; 24 pages.
PCT International Preliminary Report on Patentability and Written Opinion of the ISA for PCT Pat. App. No. PCT/US2010/024256; dated Sep. 1, 2011; 9 pages.
PCT Search Report and Written Opinion of the ISA for PCT/US2010/024256 dated Aug. 11, 2010; 14 pages.
Response filed Oct. 8, 2013; to Office Action dated Jun. 12, 2013; for U.S. Appl. No. 13/743,451; 12 pages.
Response filed Sep. 27, 2012; to Office Action dated Jul. 6, 2012; for U.S. Appl. No. 12/706,318; 12 pages.
Response to 312 Amendment; for U.S. Appl. No. 13/743,451; 2 pages.
Response to U.S. Non-Final Office Action dated Jan. 9, 2015; for U.S. Appl. No. 14/321,347; Response filed on Apr. 29, 2015; 9 pages.
Japanese Office Action dated Sep. 27, 2018 for Japanese Application No. 2017-525915 with English Translations; 17 Pages.
Japanese Office Action dated Oct. 3, 2018 for Japanese Application No. 2017-525906 with English Translations; 7 Pages.
Japanese Notice of Allowance (w/English Claims) dated Jan. 4, 2019 for Japanese Application No. 2017-525906; 7 pages.
Response to Japanese Office Action (w/English Amended Claims) filed Dec. 19, 2018 for Japanese Application No. 2017-525915; 12 pages.
Response to Japanese Office Action (w/English Amended Claims) filed Dec. 17, 2018 for Japanese Application No. 2017-525906; 11 pages.
U.S. Appl. No. 14/541,735, filed Nov. 14, 2014, Petrie et al.
Allegro MicroSystems, LLC; A3981 Automotive, Programmable Stepper Driver; datasheet; Jan. 2013; 43 pages.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482; 8 pages.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458; 4 pages.

Ausserlechner; "Limits of Offset Cancellation by the Principle of Spinning Current Hall Probe;" Proceedings of IEEE Sensors; Oct. 2004; pp. 1117-1120; 4 pages.
Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152; 4 pages.
Bahreyni, et al.; "A Resonant Micromachined Magnetic Field Sensor;" IEEE Sensors Journal; vol. 7, No. 9, Sep. 2007; pp. 1326-1334; 9 pages.
Barrettino, et al.; "CMOS-Based Monolithic Controllers for Smart Sensors Comprising Micromembranes and Microcantilevers;" IEEE Transactions on Circuits and Systems—I Regular Papers vol. 54, No. 1; Jan. 2007; pp. 141-152; 12 pages.
Baschirotto et al.; "Development and Analysis of PCB Vector 2-D Magnetic Field Sensor System for Electronic Compass;" IEEE Sensors Journal vol. 6, No. 2; Apr. 2006; pp. 365-371; 7 pages.
Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836; 8 pages.
Blagojevic et al.; "FD SOI Hall Sensor Electronics Interfaces for Energy Measurement;" Microelectronics Journal 37; Sep. 2006; pp. 1576-1583; 8 pages.
Cesaretti et al.; "Effect of Stress Due to Plastic Package Moisture Absorption in Hall Sensors;" IEEE Transactions on Magnetics, vol. 45, No. 10; Oct. 2009; 4 pages.
Communication Pursuant to Rules 161 and 162 dated Jun. 16, 2017 for European Application No. 15791841.8-1568; 2 pages.
Demierre, et al.; "Reference Magnetic Actuator for Self-Calibration of a Very Small Hall Sensor Array;" Sensors and Actuators A97-98; Apr. 2002; pp. 39-46; 8 pages.
Frick, et al.; "CMOS Microsystem for AC Current Measurement with Galvanic Isolation;" IEEE Sensors Journal; vol. 3, No. 6; Dec. 2003; pp. 752-760; 9 pages.
Halg; "Piezo-Hall Coefficients of n-Type Silicon;" Journal of Applied Physics; vol. 64, No. 1; Jul. 1, 1988; pp. 276-282; 7 pages.
Hosticka; "CMOS Sensor Systems;" Sensors and Actuators A66; Apr. 1998; pp. 335-341; 7 pages.
International Preliminary Report on patentability dated May 26, 2017 for PCT Application No. PCT/US2015/057465; 14 pages.
International Preliminary Report on patentability dated May 26, 2017 for PCT Application No. PCT/US2015/057462; 16 pages.
Kammerer et al.: "A Hall effect sensors network insensitive to mechanical stress;" Proceedings of IEEE Sensors; vol. 3, Oct. 2004; pp. 1071-1074; 4 pages.
Kanda et al.; "The Piezo-Hall Effect in n-Silicon;" $22^{nd}$ International Conference on the Physics of Semiconductors; vol. 1, Jan. 1995; pp. 89-92; 4 pages.
Kayal et al.; "Automatic Calibration of Hall Sensor Microsystems;" Microelectronics Journal 37; Sep. 2006; pp. 1569-1575; 7 pages.
Magnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366; 4 pages.
Manic et al.; "Short and Long-Term Stability Problems of Hall Plates in Plastic Packages;" IEEE $38^{th}$ Annual International Reliability Physics Symposium; Apr. 2000; pp. 225-230; 6 pages.
Manic; "Drift in Silicon Integrated Sensors and Circuits Due to the Thermo-Mechanical Stresses;" Lausanne, École Polytechnique Fédérale De Lausanne 2000; 176 pages.
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160; 7 pages.
Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540; 8 pages.
Motz, et al.; "An Integrated Hall Sensor Platform Design for Position, Angle and Current Sensing;" IEEE Sensors 2006; Exco, Daegu, Korea / Oct. 22-25, 2006; pp. 1008-1011; 4 pages.
Munter; "A Low-offset Spinning-current Hall Plate;" Sensors and Actuators A21-A23; 1990; pp. 742-746; 4 pages.

(56) References Cited

OTHER PUBLICATIONS

Munter; "Electronic Circuitry for a Smart Spinning-current Hall Plate with Low Offset;" Sensors and Actuators A; Jun. 1991; pp. 747-751; 5 pages.
Partin et al.; "Temperature Stable Hall Effect Sensors;" IEEE Sensors Journal, vol. 6, No. 1; Feb. 2006; pp. 106-110; 5 pages.
Pastre, et al.; "A Hall Sensor Analog Front End for Current Measurement with Continuous Gain Calibration;" IEEE Sensors Journal; vol. 7, No. 5; May 2007; pp. 860-867; 8 pages.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98; 4 pages.
Popovic; "Sensor Microsystems;" Proc. $20^{th}$ International Conference on Microelectronics (MWIL 95); vol. 2, NIS, Serbia, 12-14; Sep. 1995; pp. 531-537; 7 pages.
Randhawa; "Monolithic Integrated Hall Devices in Silicon Circuits;" Microelectronics Journal; vol. 12, No. 6; Sep. 14-17, 1981; pp. 24-29; 6 pages.
Response to Office Action filed Jul. 31, 2017 for U.S Appl. No. 14/541,582; 12 pages.
Response to Restriction Requirement filed Nov. 8, 2016 for U.S. Appl. No. 14/541,454; 10 pages.
Response to U.S. Non-Final Office Action dated Dec. 30, 2016 for U.S. Appl. No. 14/541,582; Response filed on Mar. 22, 2017; 11 Pages.
Ruther et al.; "Integrated CMOS-Based Sensor Array for Mechanical Stress Mapping;" $5^{th}$ IEEE Conference on Sensors, Oct. 2007; pp. 1131-1134; 4 pages.
Ruther et al.; "Theromagnetic Residual Offset in Integrated Hall Plates;" IEEE Sensors Journal; vol. 3, No. 6; Dec. 2003; pp. 693-699; 7 pages.
Sargent; "Switched-capacitor IC controls feedback loop;" EDN; Design Ideas; Feb. 17, 2000; pp. 154 and 156; 2 pages.
Schneider, et al.; "Temperature Calibration of CMOS Magnetic Vector Probe for Contactless Angle Measurement System;" IEDM; Dec. 1996; pp. 533-536; 4 pages.
Schott et al.; "Linearizing Integrated Hall Devices;" 1997 International Conference on Solid-State Sensors and Actuators, Jun. 16-19, 1997; pp. 393-396; 4 pages.
Schott, et al.; "CMOS Single-Chip Electronic Compass with Microcontroller;" IEEE Journal of Solid-State Circuits; vol. 42, No. 12; Dec. 2007; pp. 2923-2933; 11 pages.
Simon et al.; "Autocalibration of Silicon Hall Devices;" $8^{th}$ International Conference on Solid-State Sensors and Actuators; vol. 2; Jun. 25, 1995; pp. 237-240; 4 pages.
Steiner et al.; "Double-Hall Sensor with Self-Compensated Offset;" Electron Devices Meeting; IDSM '97 Technical Digest; Dec. 7-10, 1997; pp. 911-914; 4 pages.
Steiner et al; "Offset Reduction in Hall Devices by Continuous Spinning Current Method;" Sensors and Actuators A66; 1998; pp. 167-172; 6 pages.
Stellrecht et al.; "Characterization of Hygroscopic Swelling Behavior of Mold Compounds and Plastic Packages;" IEEE Transactions on Components and Packaging Technologies; vol. 27, No. 3; Sep. 2004; pp. 499-506; 8 pages.
Tian et al.; "Multiple Sensors on Pulsed Eddy-Current Detection for 3-D Subsurface Crack Assessment;" IEEE Sensors Journal, vol. 5, No. 1; Feb. 2005; pp. 90-96; 7 pages.
Trontelj et al; "CMOS Integrated Magnetic Field Source Used as a Reference in Magnetic Field Sensors on Common Substrate;" WEP 1-6; IMTC; May 1994; pp. 461-463; 3 pages.
U.S. Non-Final Office Action dated Dec. 30, 2016 for U.S. Appl. No. 14/541,582; 21 Pages.
U.S. Non-Final Office Action dated May 5, 2017 for U.S. Appl. No. 14/541,582; 18 Pages.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324; 3 pages.
Zou et al.; "Three-Dimensional Die Surface Stress Measurements in Delaminated and Non-Delaminated Plastic Packages;" 48th Electronic Components and Technology Conference; May 25, 1998; pp. 1223-1234; 12 pages.
Notice of Allowance dated Sep. 20, 2018 for European Application No. 15791841.8; 7 Pages.
Response to European Office Action dated Jun. 16, 2017 for European Application No. 15794693.0; Response filed Nov. 22, 2017; 7 Pages.
Response to European Office Action dated Jun. 16, 2017 for European Application No. 15791841.8; Response filed Dec. 21, 2017; 11 Pages.
U.S. Appl. No. 15/717,002, filed Sep. 27, 2017, Petrie et al.
PCT Search Report and Written Opinion of the ISA dated Jan. 21, 2016; for PCT/US2015/057462; 20 pages.
PCT Search Report and Written Opinion of the ISA dated Jan. 25, 2016; for PCT/US2015/057465; 18 pages.
Office Action dated Dec. 7, 2016 for U.S. Appl. No. 14/541,454; 16 pages.
Response to U.S. Non-Final Office Action dated Dec. 7, 2016 for U.S. Appl. No. 14/541,454; Response filed on Mar. 6, 2017; 16 Pages.
Non-Final Office Action dated Apr. 28, 2017 for U.S. Appl. No. 14/541,454; 34 Pages.
International Preliminary Report on patentability dated May 16, 2017 for PCT Application No. PCT/US2015/057465; 14 pages.
Response to Office Action filed Jul. 13, 2017 for U.S Appl. No. 14/541,454, 16 pages.
Notice of Allowance dated Aug. 11, 2017 for U.S. Appl. No. 14/541,582; 16 Pages.
Response to U.S. Non-Final Office Action dated May 5, 2017 for U.S. Appl. No. 14/541,582; Response filed Jul. 31, 2017; 12 Pages.
Response to U.S. Non-Final Office Action dated Dec. 30, 2016 for U.S. Appl. No. 14/541,582; Response filed Mar. 22, 2017; 11 Pages.
Notice of Allowance dated Aug. 10, 2017 for U.S. Appl. No. 14/541,454; 15 Pages.
Notice of Reason for Rejection dated Jun. 4, 2019 for JP Pat. Appl. No. 2017-525915; 5 pages.

\* cited by examiner

MAGNETIC FIELD SENSOR WITH SHARED PATH AMPLIFIER AND ANALOG-TO-DIGITAL-CONVERTER

CROSS REFERENCE TO RELATED APPLICATIONS

This is a CONTINUATION-IN-PART of U.S. patent application Ser. No. 14/541,582 (filed Nov. 14, 2014); a CONTINUATION-IN-PART of U.S. patent application Ser. No. 14/541,454 (filed Nov. 14, 2014); and a CONTINUATION-IN-PART of U.S. patent application Ser. No. 14/541,735 (filed Nov. 14, 2014); all of which are incorporated here by reference in their entireties.

FIELD

This invention relates generally to magnetic field sensors and, more particularly, to magnetic field sensors with self-calibration circuitry and techniques.

BACKGROUND OF THE INVENTION

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

Magnets, in the form of a permanent magnet, or magnetically permeable structures, sometimes referred to as concentrators or flux guides, are often used in connection with magnetic field sensors. In applications in which the ferromagnetic target is magnetic, a magnetically permeable concentrator or magnetic flux guide can be used to focus the magnetic field generated by the target on the magnetic field transducer in order to increase the sensitivity of the sensor and, allow use of a smaller magnetic target, or allow the magnetic target to be sensed from a greater distance (i.e., a larger airgap). In other applications in which the ferromagnetic target is not magnetic, a permanent magnet, sometimes referred to as a back bias magnet, may be used to generate the magnetic field that is then altered by movement of the target.

During manufacturing or during use in application, magnetic field sensors (and other parts) sometimes present failures. These failures may be due to manufacturing defects, design defects, latent failures, or a combination of both. Magnetic field sensors can also develop faults after they are installed in a working environment.

To reduce the occurrence of defective parts entering the field, parts are often tested during or after the manufacturing process. Some parts have been designed to include self-test capabilities, i.e. internal circuitry included in the part that can be used by the part to test itself during manufacturing. These self-tests may include built-in self-tests (i.e. "BIST" tests). During a so-called logical-BIST (i.e. an "LBIST" test), for example, the internal registers within the part are connected together in a scan chain so that the output of one leads to the input of the next. Data is fed through the scan chain and the result is compared to an expected value. If the result does not match the expected value, it may indicate there is a defect in the part. Certain parts may also include other types of BIST or self-test circuitry including tests that check the integrity of analog circuits.

Circuits or parts that perform testing on themselves cannot always achieve a desired level of test coverage. For example, it may be difficult or costly to design test circuits that test certain other circuits within the part. As another example, once a part is installed in its operating environment, certain types of self-tests may interrupt operation or degrade performance of the part if performed while the part is under operation.

SUMMARY

In an embodiment, a magnetic field sensor comprises at least one magnetic field sensing element configured to generate a measured magnetic field signal responsive to an external magnetic field; a diagnostic circuit configured to generate a diagnostic signal, wherein the diagnostic signal is not dependent on a measured magnetic field; a signal path comprising an amplifier and an analog-to-digital converter for processing the measured magnetic field signal to generate a sensor output signal indicative of the external magnetic field during a measured time period and for processing the diagnostic signal during a diagnostic time period; and a switch coupled to receive the measured magnetic field signal and the diagnostic signal and direct the measured magnetic field signal to the signal path during the measured time period and direct the diagnostic signal to the signal path during the diagnostic time period.

One or more of the following features may be included.

A coil may generate the external magnetic field.

The diagnostic circuit may be configured to generate the diagnostic signal during one of: the diagnostic time period, the measured time period, or both the diagnostic and measured time periods.

An analog-to-digital converter may be responsive to the measured magnetic field signal to generate a digital measured magnetic field signal and responsive to the diagnostic signal to generate a digital diagnostic signal.

The analog-to-digital converter may comprise at least one integrator circuit having a first capacitor configured to process the measured magnetic field signal and a second capacitor configured to process the diagnostic signal.

A controller may be configured to selectively couple the first capacitor to the signal path during the measured time period and couple the second capacitor to the signal path during the diagnostic time period.

An output signal generator may be responsive to the measured magnetic field signal and to the diagnostic signal to generate the sensor output signal.

The at least one magnetic field sensing element may comprise: a Hall effect element, a magnetoresistance element, or both.

In another embodiment, a magnetic field sensor comprises at least one magnetic field sensing element configured to generate a measured magnetic field signal responsive to an external magnetic field; a diagnostic circuit configured to generate a diagnostic signal; a signal path comprising a shared portion for processing the measured magnetic field signal to generate a sensor output signal indicative of the external magnetic field during a measured time period and for processing the diagnostic signal to determine whether a fault is present during a diagnostic time period, and a dedicated portion for processing the measured magnetic field signal during the measured time period; and a controller configured to enable the dedicated signal path portion to process the diagnostic signal.

One or more of the following features may be included.

An analog-to-digital converter comprising at least one integrator may be included, wherein the dedicated signal path portion comprises a first capacitor dedicated to processing the measured magnetic field signal and a second capacitor dedicated to processing the diagnostic signal.

The controller may be configured to enable the dedicated signal path portion to process the diagnostic signal during the diagnostic time period.

The diagnostic circuit may be electrically coupled directly to the at least one magnetic field sensing element to direct the diagnostic signal to the at least one magnetic field sensing element.

The diagnostic signal may be a power signal that drives the at least one magnetic field sensing element.

In another embodiment, a magnetic field sensor comprises at least one magnetic field sensing element configured to generate a measured magnetic field signal responsive to an external magnetic field; a diagnostic circuit configured to generate a diagnostic signal; a multiplexor coupled to receive the measured magnetic field signal and the diagnostic signal as inputs, and provide either the magnetic field signal or the diagnostic signal as an output; and a signal processing path coupled to receive the output of the multiplexor and process the measured magnetic field signal to generate a sensor output signal indicative of the external magnetic field during a measured time period, and process the diagnostic signal to determine whether a fault is present during a non-overlapping diagnostic time period.

One or more of the following features may be included.

A control circuit may be coupled to the multiplexor and configured to cause the multiplexor to provide the measured magnetic field signal as the output during the measured time period, and provide the diagnostic signal as the output during the diagnostic time period.

An analog-to-digital converter (ADC) may be responsive to the measured magnetic field signal to generate a digital measured magnetic field signal and responsive to the diagnostic signal to generate a digital diagnostic signal.

The ADC may comprise a first ADC signal path for processing the measured magnetic field signal and a second ADC signal path for processing the diagnostic signal.

The control circuit may be configured to selectively couple the first ADC signal path to the signal processing path during the measured time period and selectively couple the second ADC signal path to the signal processing path during the diagnostic time period.

The at least one magnetic field sensing element may be selected from a Hall effect element, a magnetoresistance element, or both.

BRIEF DESCRIPTION OF THE DRAWINGS

The foregoing features of the disclosure, as well as the disclosure itself may be more fully understood from the following detailed description of the drawings, in which.

DETAILED DESCRIPTION

Figure 1:
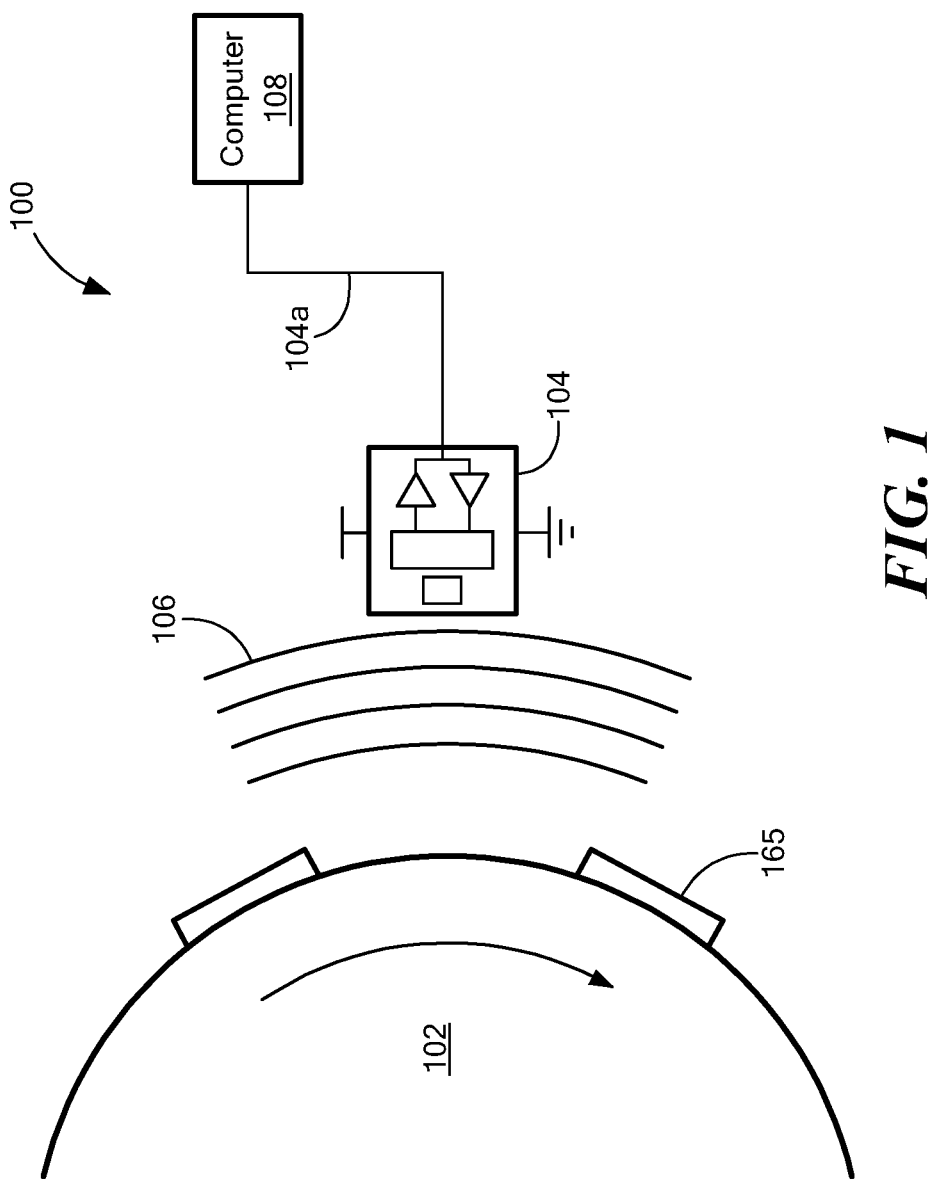
FIG. 1 is a block diagram of a system including a magnetic field sensor.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor may be used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

Turning to FIG. 1, a block diagram of a system 100 for detecting a target 102 is shown to include a magnetic field sensor 104 placed adjacent to target 102 so that a magnetic field 106 can be sensed by magnetic field sensor 104. In an embodiment, target 102 is a magnetic target and produces external magnetic field 106. In another embodiment, magnetic field 106 is generated by a magnetic source (e.g. a back-bias magnet or electromagnet) that is not physically coupled to target 102. A target 102 may be either a magnetic or a non-magnetic target. In these instances, as target 102 moves through or within magnetic field 106, it causes perturbations to external magnetic field 106 that can be detected by magnetic field sensor 104.

Magnetic field sensor 104 may detect and process changes in external magnetic field 106. For example, magnetic field sensor 104 may detect changes in magnetic field 106 as target 102 rotates and features 105 move closer to and away from magnetic field sensor 104, thus increasing and decreasing the strength of the magnetic field 106 sensed by magnetic field sensor 104. Magnetic field sensor 104 may include circuitry to determine the speed, direction, proximity, angle, etc. of target 102 based on these changes to magnetic field 106. Although magnetic target 102 is shown as a toothed gear, other arrangements and shapes that can affect magnetic field 106 as target 102 rotates are possible. For example, magnetic target 102 may have a non-symmetrical shape (such as an oval), may include sections of different material that affect the magnetic field, etc.

In an embodiment, magnetic sensor 104 is coupled to a computer 108, which may be a general purpose processor executing software or firmware, a custom processor, or a custom electronic circuit for processing output signal 104a from magnetic sensor 104. Output signal 104a may provide information about the speed, position, and/or direction of motion of target 102 to computer 108, which may then perform operations based on the received information. In an embodiment, computer 108 is an automotive computer (also referred to as an engine control unit) installed in a vehicle and target 102 is a moving part within the vehicle, such as a transmission shaft, a brake rotor, etc. Magnetic sensor 104 detects the speed and direction of target 102 and computer 108 controls automotive functions (like all-wheel drive, ABS, speedometer display control, etc.) in response to the information provided by magnetic field sensor 104.

In an embodiment, computer 108 may be located relatively distant from magnetic field sensor 104. For example, computer 108 may be located under the hood of a vehicle while magnetic field sensor 104 is located at a wheel or transmission element near the bottom and/or rear of the vehicle. In such an embodiment, having a serial communication interface with a minimal number of electrical connections (e.g. wires) between computer 108 and magnetic field sensor 104 may be beneficial, and may reduce cost and maintenance requirements.

In embodiments, where magnetic field sensor 104 operates as part of a system that affects vehicular safety such as the brake or transmission system, it may be desirable for magnetic field sensor 104 to perform self-tests and report to computer 108 any errors or faults that occur.

In embodiments, magnetic field sensor 104 includes built-in self-test ("BIST") circuits or processes that can test magnetic field sensor 104. The self-tests can include analog tests that test analog circuit portions of magnetic field sensor 104 and digital tests that test digital circuit portions of magnetic field sensor 104. The self-tests may also include test circuits or procedures that test both analog and digital portions of magnetic field sensor 104. It may be desirable for the self-tests to provide test coverage of magnetic field sensor 104 that includes as many circuits as possible, in order to increase the test coverage and effectiveness of the tests in finding faults.

Figure 2:
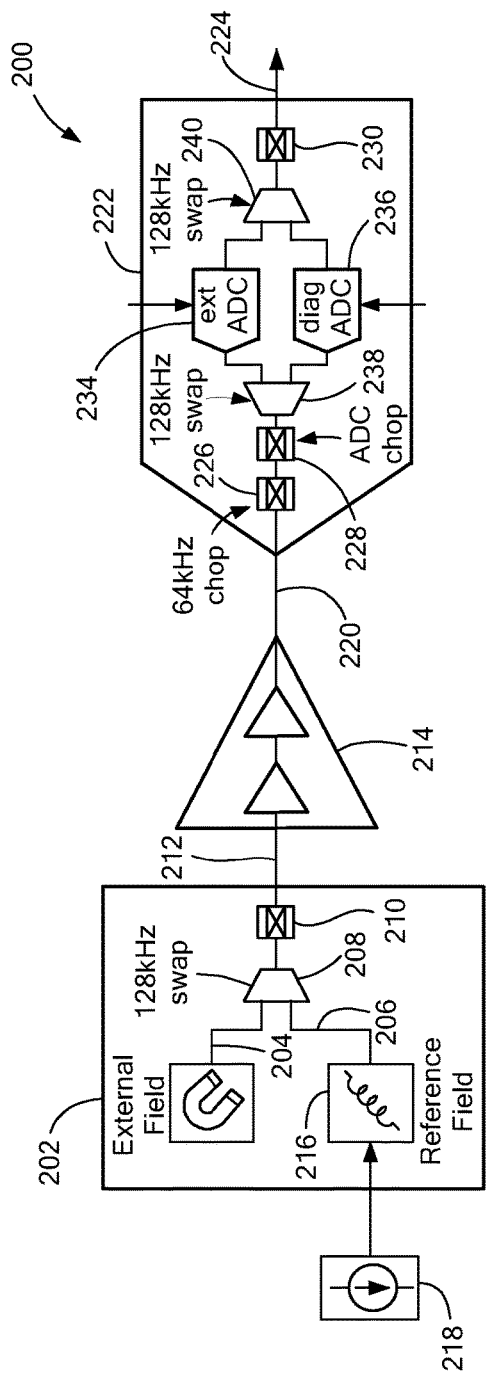
FIG. 2 is a block diagram of a magnetic field sensor including an amplifier and a dual-path analog-to-digital converter.

Referring now to FIG. 2, a block diagram illustrates a circuit 200 that may be included in or as part of magnetic field sensor 104. Circuit 200 may be configured to detect a magnetic field (such as magnetic field 106) and process signals representing the detected magnetic field. Circuit 200 may also be configured to generate a reference magnetic field having a predetermined strength, and to perform self-tests by, for example, processing signals related to the reference magnetic field and comparing the processed signals to an expected value.

Circuit 200 includes one or more so-called signal paths, which is a path through circuit 200 over which a signal is propagated while the signal is being processed. For example, a signal may be generated by hall element(s) 202, then propagated to amplifier 214, then propagated to ADC 222 and through either converter circuit 234 or 236, and then finally propagated to an output of ADC 222 as signal 224. In general, the term signal path may refer to an electronic path, through one or more circuits, though which a signal travels. The term signal path may be used to describe an entire path or a portion of a path through which the signal travels.

In an embodiment, circuit 200 includes one or more magnetic field sensing elements (e.g. magnetic field sensing element 202) configured to measure an external magnetic field (such as magnetic field 106) and generate a measured magnetic field signal 204 that is responsive to the external magnetic field. Magnetic field sensing element 202 may also be configured measure a reference magnetic field and generate reference magnetic field signal 206 in response to the reference magnetic field. In embodiments, magnetic field sensing element 202 may be a Hall effect element, a magnetoresistive element, or another type of circuit or element that can detect a magnetic field.

Circuit 200 may also include a coil 216 which may be located proximate to magnetic field sensing element 202. A driver circuit 218 may produce a current that flows through coil 216 to produce the reference magnetic field mentioned above. The reference magnetic field may have a predetermined strength (e.g. a predetermined magnetic flux density) so that reference magnetic field signal 206 has a known value and produces predicable results when processed by circuit 200.

In an embodiment, the reference magnetic field and the external magnetic field may have magnetic field directions that are opposite to each other, or otherwise configured, so that they do not interfere with each other. The reference magnetic field signal may be a differential magnetic field that averages out when the Hall plates are in a non-differential configuration. For example, magnetic field sensing element 202 has an axis of maximum sensitivity that may be changed or switched so that, in one arrangement, the axis of maximum sensitivity is aligned to allow magnetic field sensing element 202 to detect the external magnetic field 106 and, in another arrangement, the axis of greatest sensitivity is aligned to allow magnetic field sensing element 202 to detect the reference magnetic field produced by coil 216.

In certain arrangements, coil 216 can be replaced by a permanent magnet or other magnetic source that can produce a predetermined reference magnetic field that can be detected by magnetic field sensing element 202.

Circuit 200 may also include a multiplexor 208, a chopping circuit 210, and/or other mechanisms or switch circuits that can switch a signal line (e.g. signal 212) so that measured magnetic field signal 204 is provided as an input to amplifier 214 during a measured time period and reference magnetic field signal 206 is provided as an input to amplifier 214 during a reference time period. An example of a chopping circuit is described in U.S. patent application Ser. No. 13/398,127 (filed Feb. 16, 2012), which is incorporated here by reference in its entirety.

Amplifier 214 is configured to receive and amplify measured magnetic field signal 204 during the measured time period, and to receive and amplify reference magnetic field signal 206 during the reference time period. In an embodiment, signals 204 and 206 are differential signals and amplifier 214 is a differential amplifier.

The output of amplifier 214 (i.e. amplified signal 220) may be an analog signal in certain embodiments. Thus, circuit 200 may include an analog-to-digital converter ("ADC") circuit 222 coupled to receive amplified signal 220 and convert it to a digital signal 224. Because amplifier 214 receives measured magnetic field signal 204 during a measured time period, and receives reference magnetic field signal 206 during a reference time period, amplified signal 220 may represent both signals at different times. It may represent measured magnetic field signal 204 during the measured time period and may represent reference magnetic field signal 206 during the reference time period.

ADC 222 may be referred to here as a so-called dual-path ADC because ADC 222 may have some shared circuit portions that process both measured magnetic field signal 204 and reference magnetic field signal 206, and may have other dedicated circuit portions that are configured to process either measured magnetic field signal 204 or reference magnetic field signal 206. For example, chopping circuits 226, 228, and 230 may be shared circuit portions that are configured to process both signals 204 and 206. In contrast, converter circuit 234 may be configured to process measured magnetic field signal 204 while converter circuit 236 may be configured to process reference magnetic field signal 206. ADC 222 may include multiplexors 238 and 240, or other switching circuits, that can selectively couple and de-couple converter circuits 234 and 236 from the other circuits included in ADC 222 so that converter circuit 234 processes measured magnetic field signal 204 during the measured time period and converter circuit 236 processes reference magnetic field signal 206 during the reference time period.

In an embodiment, converter circuit 234 comprises one or more capacitors that are included in an integrator circuit, and converter circuit 236 comprises one or more capacitors that are included in the same integrator circuit. As will be discussed below, ADC 222 may include one or more integrator circuits each having at least two sets of one or more capacitors each, a first set for processing measured magnetic field signal 204 and a second set for processing reference magnetic field signal 206. This will be discussed below in greater detail.

Periodically, the sets of capacitors can be swapped so that the first set of capacitors processes the reference magnetic field signal 206 and the second set of capacitors processes measured magnetic field signal 204. If the reference magnetic field signal 206 is a test signal, then swapping the capacitors can allow both sets of capacitors to process the test signal and receive test coverage.

In operation, the measured time period and the reference time period are alternating, non-overlapping time periods, and circuit 200 processes measured magnetic field signal 204 and reference magnetic field signal 206 in a time-division multiplexed ("TDM") manner. For example, during the measured time period, multiplexor 208 may be configured to propagate measured magnetic field signal 204 through to amplifier 214, and multiplexors 238 and 240 may be configured to couple converter circuit 234 to the signal path and decouple converter circuit 236 from the signal path. During the reference time period, multiplexor 208 may be configured to propagate reference magnetic field signal 206 through to amplifier 214, and multiplexors 238 and 240 may be configured to couple converter circuit 236 to the signal path and decouple converter circuit 236 from the signal path.

In an embodiment, converter circuits 234 and 236 can be swapped, as described above, after a predetermined number of time periods. If the reference magnetic field signal 206 is a test signal, this will allow both converter circuits to be tested because, by swapping them, they will each be exposed to and each process the test signal. Converter circuits 234 and 236 may also be swapped in response to a command received by the magnetic field sensor from computer 108, or in response to any other schedule or trigger.

The magnetic field produced by coil 216 may have a known value, i.e. a known strength or flux density. Thus, during the measured time period, amplified signal 220 and digital signal 224, which are ultimately derived from the magnetic field produced by coil 216 during the measured time period, may also have expected values. These expected values can be compared to predetermined test values to determine if there is a fault in circuit 200. Test coverage in circuit 200 may be increased because most of the circuitry, including amplifier 214, are shared circuits that process both the measured magnetic field signal 204 and the reference magnetic field signal 206. Using the test circuitry to process both signals increases accuracy and coverage of the test results.

Variations in silicon circuit fabrication can limit the accuracy of the measurement of the reference signal generated by the coil 216. As an example, variations in Hall plate fabrication (e.g., thickness of silicon doping, alignment of optical masks, etc.) may cause variations in Hall plate sensitivity, or responsiveness to the reference magnetic field produced by coil 216. As another example, variations in resistor fabrication (e.g., impurity atoms in the silicon material) may cause variations, as a function of temperature for example, in the coil current used to generate the reference field. Both variations can cause the measured reference field to stray from its expected value. It can be difficult to determine if this error in the reference field measurement is due to variation in the fabrication process or is due to a failure in the device. Therefore, after fabrication, the gain and/or offset of the measured reference signal can be trimmed (i.e. adjusted), as a function of temperature, so that it matches its expected value. In an embodiment, adjusting the gain and offset after fabrication includes setting or configuring a trimming circuit to perform the desired gain and/or offset of the signal. Errors in the reference field measurement detected after factory trim are then detected as circuit failures rather than variations due to silicon fabrication.

Circuit 200 may also include a trim circuit 230 that can be used to shape digital signal 224. The trim circuit 230 may include digital filters, digital adders and multipliers, and other circuits that can adjust the gain and offset of the output reference magnetic field signal (e.g. the signal produced as a result of circuit 200 processing the reference magnetic field signal 206). In an embodiment, trim circuit 230 may be an analog circuit containing analog filters and amplifiers, and may be coupled between amplifier 214 and ADC 222. Trim circuit 230 may also include chopping circuits and/or other circuits to shape signal 224. In other embodiments, trim circuit 230 may be included or embedded as part of ADC 222, or may be included or embedded in circuitry that controls the Hall plates. In the latter example, the trim circuitry may adjust the current through the Hall plate in order to adjust the Hall plate's sensitivity. Adjusting digital signal 224 during the reference time period can result in a more accurate test signal that can be compared, with greater accuracy, to the test limits described above.

Circuit 200 may also include a temperature sensor circuit (not shown in FIG. 2, but see FIG. 4) to sense the temperature of circuit 200. The amount of gain and offset adjustment performed by trim circuit 230 may be based on the temperature measured by the temperature sensor circuit. For example, if the temperature reading is high, trim circuit 230 may apply more or less gain and offset adjustment than if the temperature is low, or vice versa.

Figure 3:
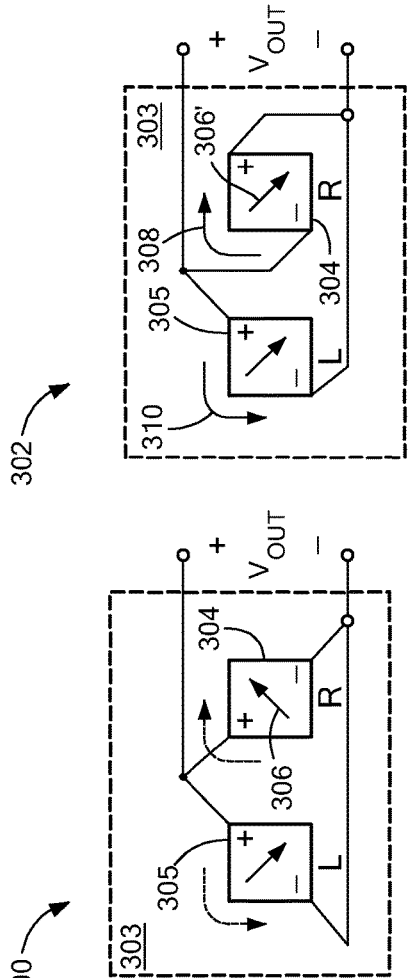
FIG. 3. is a circuit diagram of a magnetic field sensing element illustrating chopped or switched connections to the magnetic field sensing element.

Turning now to FIG. 3, a circuit diagram 300 illustrates switching of a magnetic field sensing element in order to allow the magnetic field sensing element to detect an external magnetic field and a reference magnetic field. In diagram 300, magnetic field sensing element 303, which may be the same as or similar to magnetic field sensing element 202, includes two Hall plates 304 and 305. Magnetic field sensing element 303 is arranged so that a current 306 flows through Hall plate 304 in a first direction (e.g. from the bottom left to the top right as shown in diagram 300), and the output voltage $V_{OUT}$ of magnetic field sensing element 303 is taken across Hall plate 304 from the top left to the bottom right. Magnetic field sensing element 303 is also arranged so that a current 306 flows through Hall plate 305 in a first direction (e.g. from the top left to the bottom right as shown in diagram 300), and the output voltage $V_{OUT}$ of magnetic field sensing element 303 is taken across Hall plate 305 from the top right to the bottom left. In this arrangement, the Hall plates 304 and 305 provide an average of the detected external magnetic field 106 and reject the reference magnetic field. The axis of maximum sensitivity of the Hall plates may be configured to detect external magnetic field 106. I.e. with the current 306 flowing in this direction, the axis of greatest sensitivity of magnetic field sensing element 304 may be aligned to detect external magnetic field 106. Thus, this arrangement may be used during the measured time period to detect external magnetic field 106. Although not required, the driver circuit 218 that energizes coil 216 to produce the reference magnetic field may be disabled during measured time period so that the reference magnetic field does not interfere with the detection of external magnetic field 106 by magnetic field sensing element 303.

In diagram 302, Hall plate 304 may be switched so that current 306' flows from the top left to the bottom right, and the output voltage $V_{OUT}$ of magnetic field sensing element 304 is taken across Hall plate 304 from the bottom left to the top right. Additionally, Hall plate 305 may be switched so that current 306' also flows from the top left to the bottom right, but the output voltage $V_{OUT}$ of magnetic field sensing element 303 is taken across Hall plate 305 from the top right to the bottom left. In this arrangement, the Hall plates 304 and 305 may cancel or reject the external magnetic field 106 and provide an average of the reference magnetic field produced by coil 216. With the current 306' flowing in this direction, the axis of greatest sensitivity of Hall plate 304 may be aligned to detect the reference magnetic field produced by coil 216.

In an embodiment, the reference magnetic field produced by coil 216 is a differential magnetic field, and the arrangements of Hall plates 304 and 305 in diagram 302 allows magnetic field sensing element 303 to detect the differential magnetic field. For example, current may flow through at least a portion of coil 216 in the direction of arrow 308 to produce a local magnetic field with a direction into the page near Hall plate 304.

Current may also flow through another portion of coil 216 (or through another coil) in the direction of arrow 310 to produce a magnetic field with a direction out of the page near Hall plate 305. In the arrangement shown in diagram 302, Hall plate 304 may be configured to detect the magnetic field produced by current flowing in direction 308 and having a direction into the page, and Hall plate 305 may be configured to detect the magnetic field produced by the current flowing in direction 310 and having a direction out of the page. U.S. Pat. No. 8,680,846, which is incorporated here by reference, includes other examples of Hall plate configurations.

The illustrated configurations in FIG. 3 show one way to alternately generate a reference magnetic field signal 206. In other embodiments, there may be other possible circuits and techniques that can generate a reference magnetic field 206 that can be processed by circuit 200.

Figure 4:
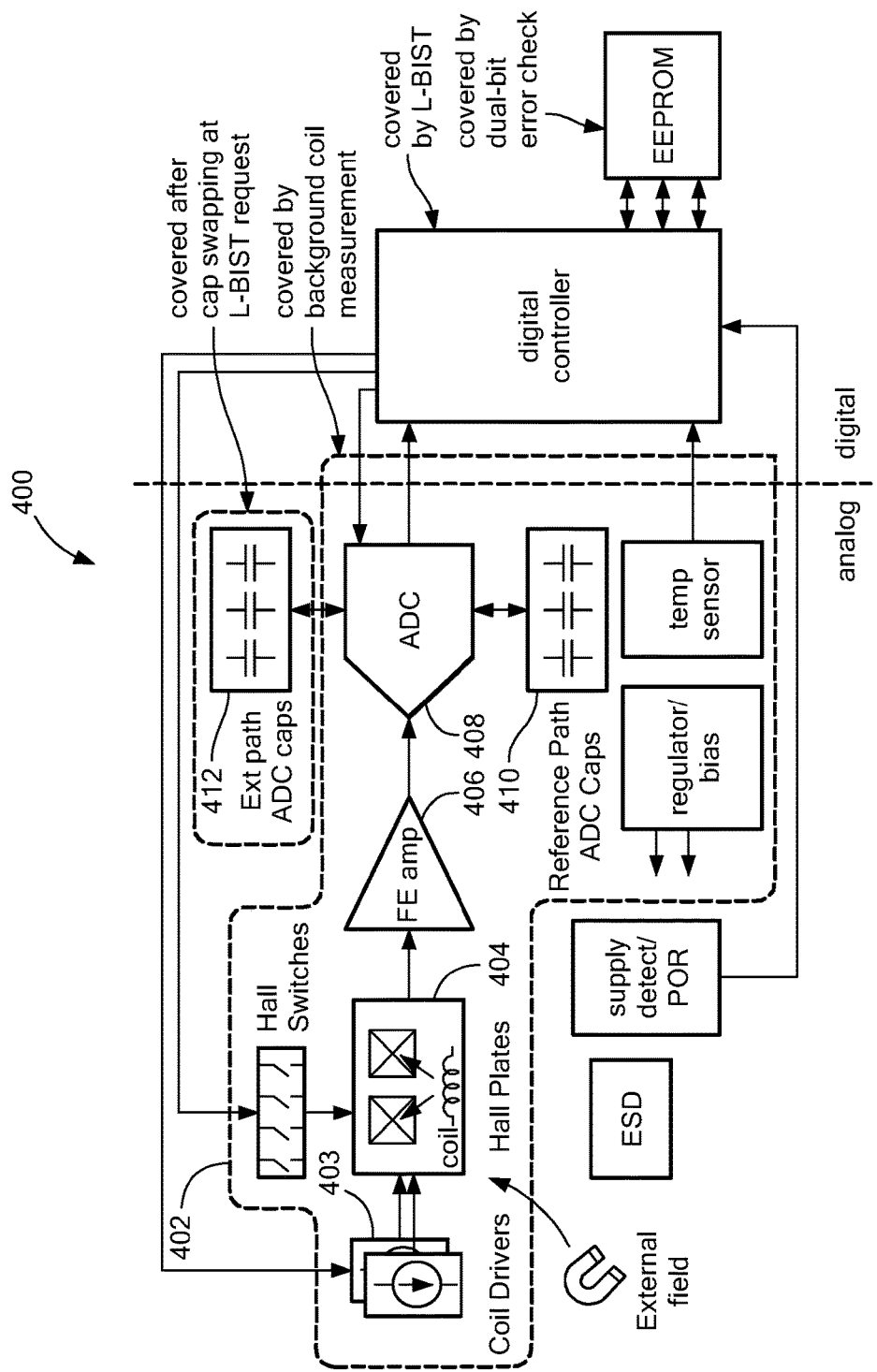
FIG. 4 is a block diagram of a magnetic field sensor illustrating test coverage.

Referring now to FIG. 4, a block diagram of a circuit 400 illustrates test coverage of the circuit. Circuit 400 may be the same as or similar to circuit 200 in FIG. 2. In an embodiment, the circuit elements within box 402 may receive test coverage while circuit 200 processes reference magnetic field signal 206. The elements may receive test coverage because they contribute to processing the reference magnetic field signal. For example, if the processed referenced magnetic field signal differs from an expected value, it can be inferred that there is a fault in at least one of the elements that contributed to processing the signal, i.e. at least one of the elements within box 402.

These elements, which the exception of capacitors 410, may be shared elements, meaning that they are configured to process both measured magnetic field signal 204 and reference magnetic field signal 206. These elements include Hall driver circuits (not shown), coil driver circuits 403, the magnetic field sensing elements 404, the amplifier 406, the ADC 408, reference signal capacitors 410, and other circuits such as regulators, biasing circuits, temperature sensors, etc. In an embodiment, magnetic field sensing elements 404 may be the same as or similar to magnetic field sensing element 202, amplifier 406 may be the same as or similar to amplifier 214, ADC 408 may be the same as or similar to ADC 222, and reference signal capacitors 410 may be the same as or similar to converter circuit 236.

Measured signal capacitors 412, which may be the same as or similar to converter circuit 234, are shown outside of test coverage box 402 because they are configured to process the measured magnetic field signal 204 and not the reference magnetic field signal 206. However, as described above, these capacitors 410 and 412 may be periodically swapped so that capacitors 412 may periodically process the reference magnetic field signal 206. Thus, test coverage may be extended to capacitors 412 during the times when capacitors 412 are processing the reference magnetic field signal 206. Additional test circuitry and techniques may also be included in magnetic field sensor 104 to test digital portions of magnetic field sensor 104, such as logic BIST circuits to test a digital controller and a dual-bit error check to test an EEPROM, for example.

Figure 5:
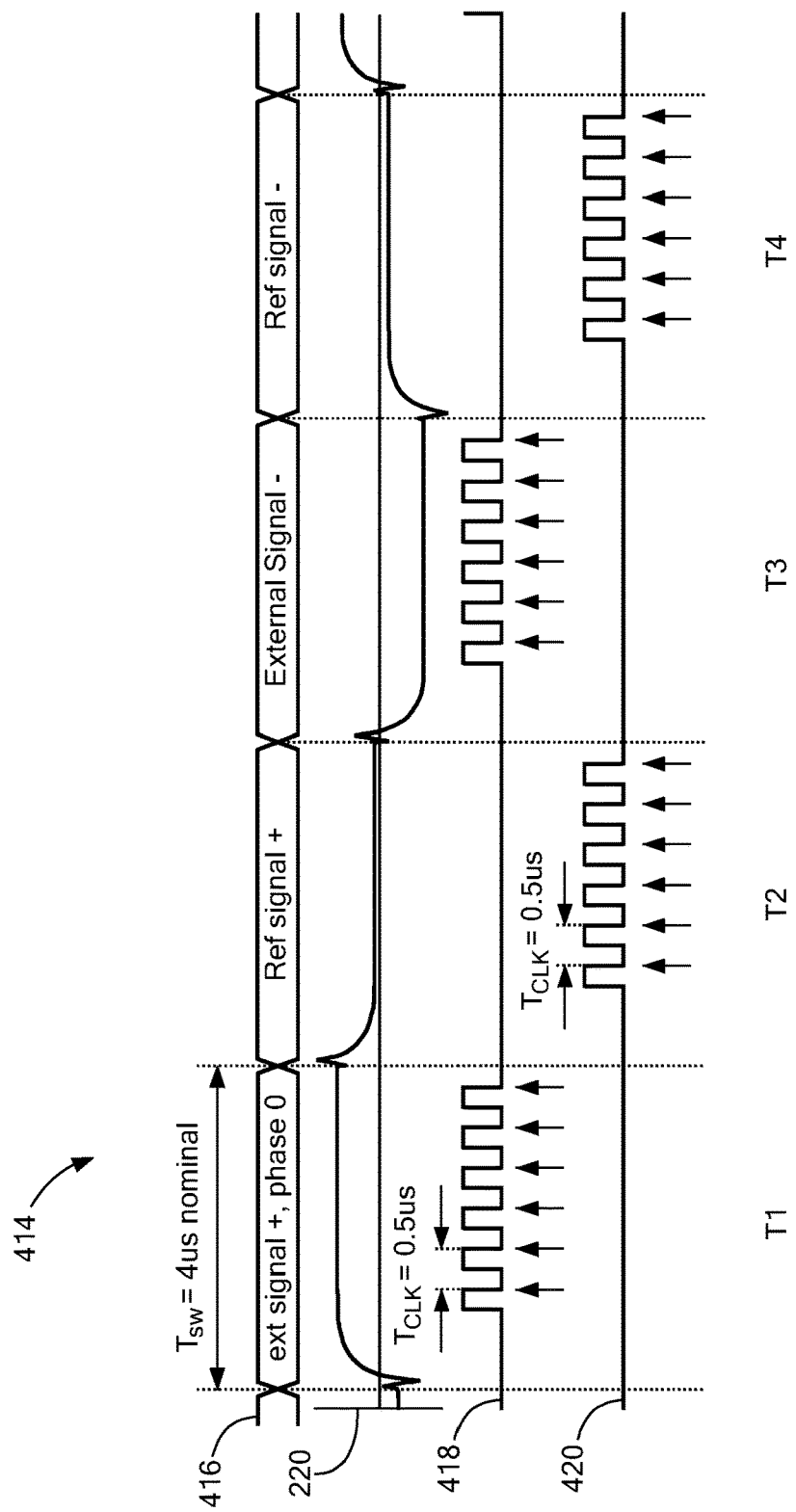
FIG. 5 is a timing diagram of signals related to the magnetic field sensor of FIG.

Referring to FIG. 5, a timing diagram 414 illustrates signals associated with circuit 200 of FIG. 2. Signal 416 illustrates the alternating time period. For example, time periods T1 and T3 correspond to a measured time period when circuit 200 is processing measured magnetic field signal 204, and time periods T2 and T4 correspond to a reference time period when circuit 200 is processing reference magnetic field signal 206. Amplified signal 220 shown in the timing diagram is the output signal produced by amplifier 214. Clock signals 418 and 420 are internal clock signals of ADC 222. Clock signal 418 is used to process measured magnetic field signal 204 and may be active during time periods T1 and T3. Clock signal 420 is used to process reference magnetic field signal 206 and may be active only time periods T2 and T4.

During time period T1, circuit 200 measures the external magnetic field 106. For example, multiplexor 208 may couple measured magnetic field signal 204 to the signal path during T1. Thus, during time period T1, signal 220 corresponds to measured magnetic field signal 204. Also during T1, converter circuit 234 is enabled and used by ADC 222 to convert signal 220 to a digital signal. During time period T2, circuit 200 measures the reference magnetic field produced by coil 216. For example, multiplexor 208 may couple reference magnetic field signal 206 to the signal path. Thus, during time period T2, signal 220 corresponds to reference magnetic field signal 206 during time period T2.

Although digital signal 224 is not shown in FIG. 5, digital signal 224 is a digital-signal version of amplified signal 220 and should follow amplified signal 220. In an embodiment, if reference signal 206 is a test signal with a known or expected value, then signal 220 and/or digital signal 224 can be compared to a test value or threshold to determine if there is a fault in circuit 200 in order to generate a diagnostic signal indicative of whether a fault is present. For example, a comparator or other circuit can compare signal 220 and/or signal 224 to a test threshold. If one or both of the signals fall outside a range of expected test values, for example, it may indicate a fault in circuit 200. Circuit 200 may also include a circuit that asserts a fault signal in the case of a fault. The fault signal may be received, for example, by computer 108 (FIG. 1) which may process and respond to the fault.

Figure 6:
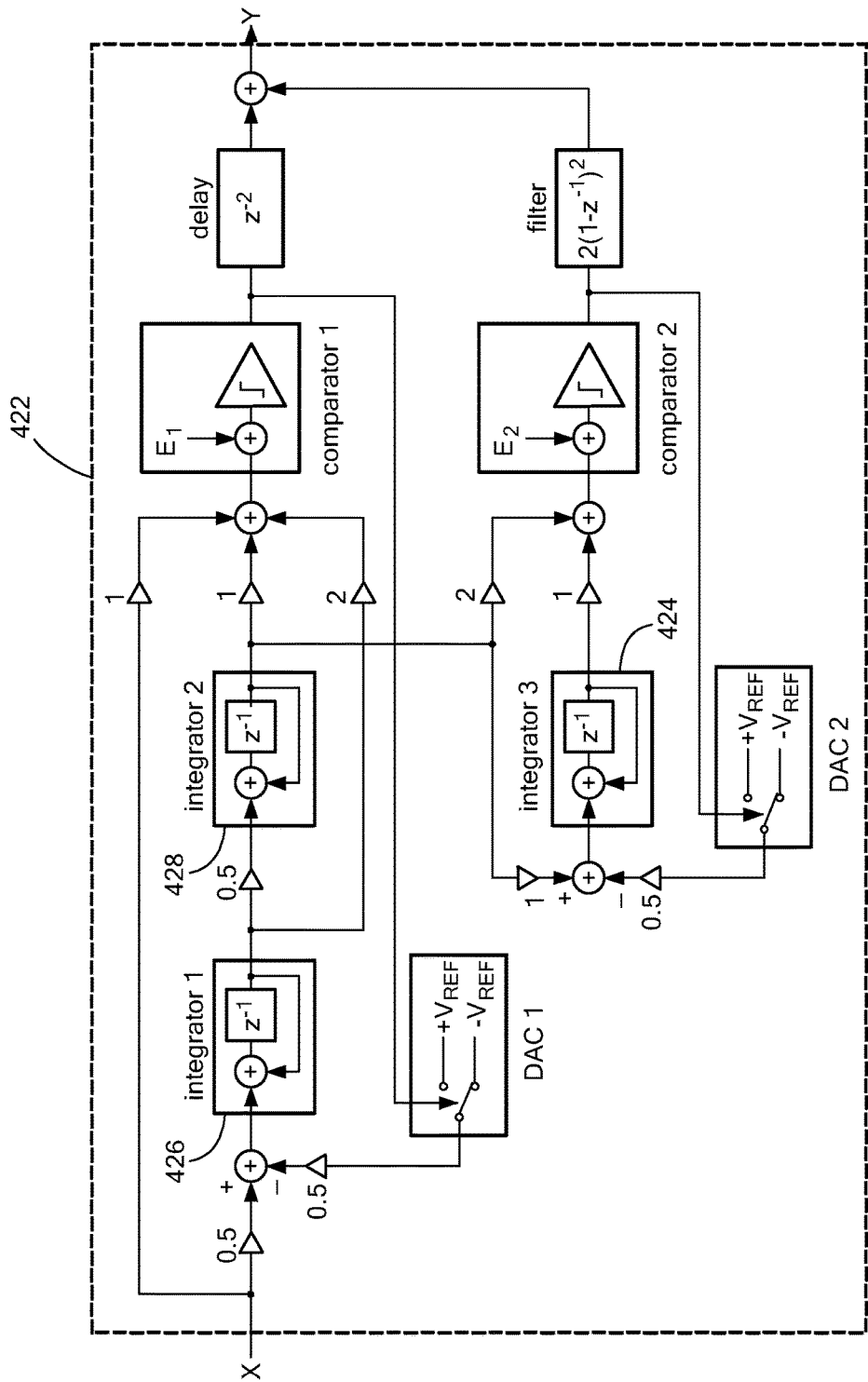
FIG. 6 is a block diagram of an analog-to-digital converter.

Referring to FIG. 6, ADC circuit 422 may be the same as or similar to ADC 222 in FIG. 2. In an embodiment, ADC 422 is a sigma-delta type analog-to-digital converter having one or more integrator circuits (e.g. integrator circuits 424, 426, and 428) as shown. However, ADC circuit 422 may be any type of analog-to-digital converter. Also, ADC 422 may be a so-called multi-path or dual-path analog-to-digital converter circuit. In other words, ADC 422 may include two or more signal paths including a first signal path for processing measured magnetic field signal 204 during a measured time period, and a second signal path for processing reference magnetic field signal 206 during a reference time period. In an embodiment, the two or more signal paths are located in at least one of the integrator circuits.

As mentioned above, the measured time period and the reference time period may be alternating time periods. Accordingly, the first signal path may be enabled (e.g. coupled to the main signal path) during the measured time period and disabled (e.g. decoupled from the main signal path) during the reference time period, and the second signal path may be disabled during the measured time period and enabled during the reference time period.

Figure 7:
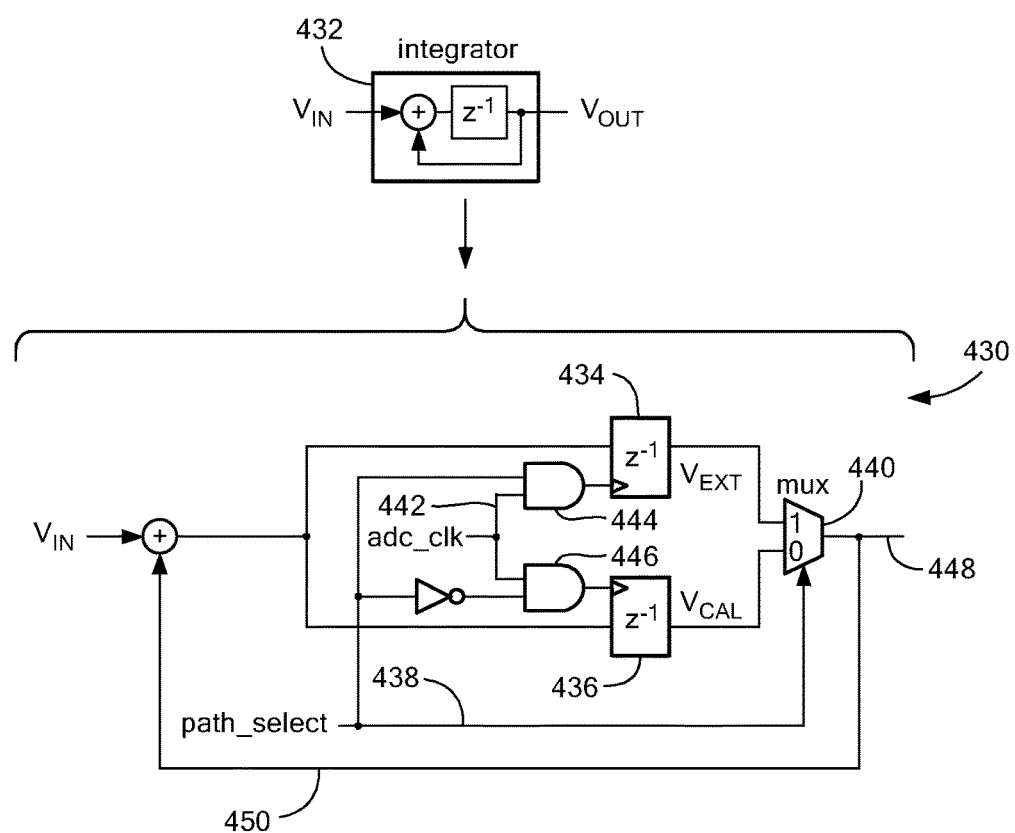
FIG. 7 is a functional block diagram of an integrator circuit.

Referring to FIG. 7, a functional block diagram 430 illustrates the operation of a dual-path or multi-path integrator circuit 432. Integrator circuit 432 may be the same as or similar to any or all of integrator circuits 424, 426, and 428.

Integrator circuit 432 may include a first signal path comprising converter circuit 434 and configured to process measured magnetic field signal 204, and a second signal path comprising converter circuit 436 and configured to process reference magnetic field signal 206. Converter circuits 434 and 436 may be the same as or similar to, or may form a portion of, converter circuits 234 and 236 in FIG. 2.

Converter circuits 434 and 436 may be analog memory elements formed by storing a voltage charge on a switched capacitor. Each integrator may be a discrete time operation circuit where the previous output state of the integrator is summed with the current input of the integrator to produce the next output state, as illustrated by feedback signal 450. Each integrator may have two or more analog memory elements, where each memory element can be used to process a different signal, and store a voltage charge associated with the signal while other signals are being processed.

As shown in FIG. 7, Integrator circuit 430 may include a path select signal 438, a multiplexor 440, a clock signal 442, and logic AND gates 444 and 446. Of course the logic gates can be replaced with any type of logic gates or switch with equivalent functionality.

In operation, path select signal 438 can be used to enable and disable converter circuits 434 and 436. When path select signal 438 is high, converter circuit 434 receives clock signal 442, converter circuit 436 is disabled because it does not receive the clock signal, and multiplexor 440 couples the output of converter circuit 434 to the output 448. When path select signal 438 is low, converter circuit 434 is disabled because it does not receive clock signal 442, converter circuit 436 is enabled because it receives clock signal 442, and multiplexor 440 couples the output of converter circuit 436 to the output 448. In an embodiment, path select signal 438 may be high during the measured time period to allow converter circuit 434 to process measured magnetic field signal 204, and low during the reference time period to allow converter circuit 436 to process reference magnetic field signal 206. Path select signal 438 can be inverted (e.g. high during the reference time period and low during the measured time period) in order to swap converter circuits 434 and 436 so they both receive test coverage, as described above.

Figure 8:
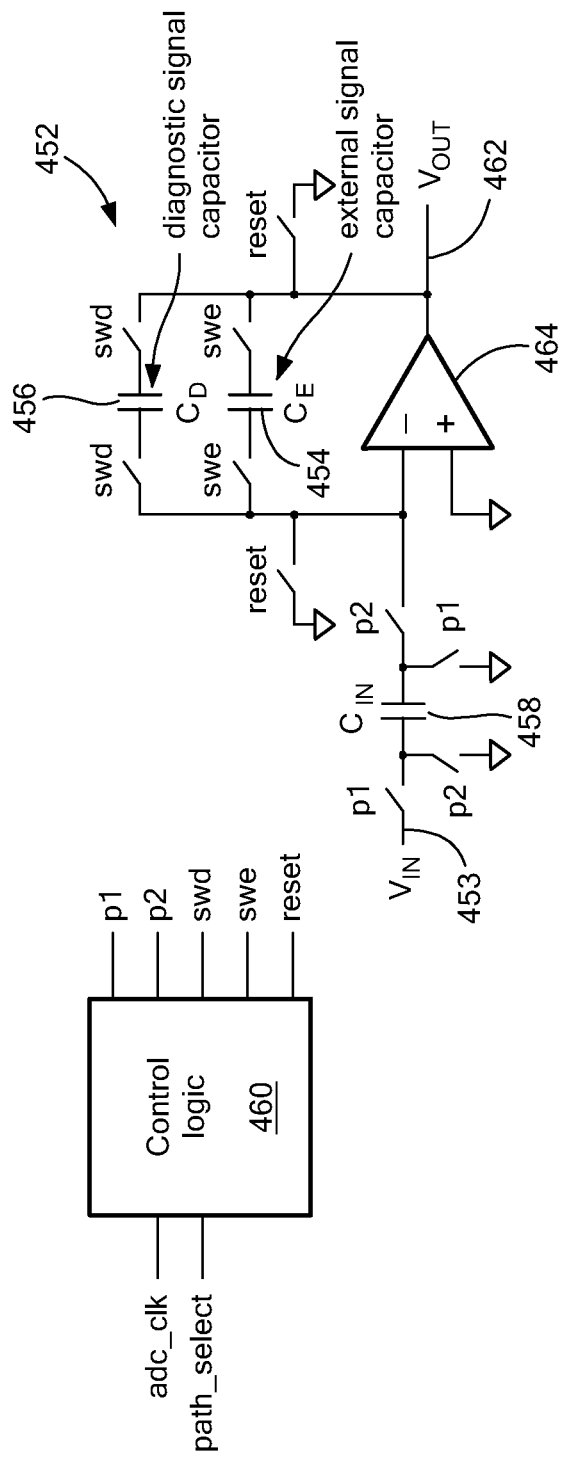
FIG. 8 is a circuit diagram of an integrator circuit.

Referring now to FIG. 8, a circuit diagram of an embodiment of an integrator circuit 452 is coupled to receive input signal 453 and produce output signal 462. Integrator circuit 452 may be an implementation or a subset of converter circuits 234 and 236. Integrator circuit 452 may also be the same as or similar to integrator circuit 432. Integrator circuit 452 includes a first signal path comprising one or more first capacitors 454, and a second signal path comprising one or more second capacitors 456. Note that while capacitors 454 and 456 are shown as single capacitors, it will be appreciated that capacitors 454 and/or 456 can be multiple capacitors coupled in series, in parallel, capacitors arranged in a differential configuration (i.e. to receive a differential signal), or in a combination of these.

Integrator circuit 452 may also have shared elements, such as operational amplifier 464, used to process both measured magnetic field signal 204 and reference magnetic field signal 206. In an embodiment, capacitors 454 are not shared circuit elements (i.e. are dedicated elements). Capacitors 454 may be configured to process measured magnetic field signal 204 during the measured time period, and capacitors 456 may be configured to process reference magnetic field signal 204 during the reference time period.

In an embodiment, a control circuit 460 controls switches swd to selectively couple and decouple capacitors 456 from the signal path, and controls switches swe to selectively couple and decouple capacitors 454 from the signal path. Control circuit 460 also controls switches p1 and p2 to selectively couple shared input capacitor 458 to the inverting input of the operational amplifier 464.

In operation, capacitors 454 are coupled to the signal path during the measured time period and decoupled from the signal path during the reference time period, and capacitors 456 are coupled to the signal path during the reference time period and decoupled from the signal path during the measured time period. In an embodiment, switches swd open and close at substantially the same time so that the voltage across capacitors 456 is retained while capacitors 456 are decoupled from the signal path, and switches swe open and close at substantially the same time so that the voltage across capacitors 454 is retained while capacitors 454 are decoupled from the signal path.

Figure 9:
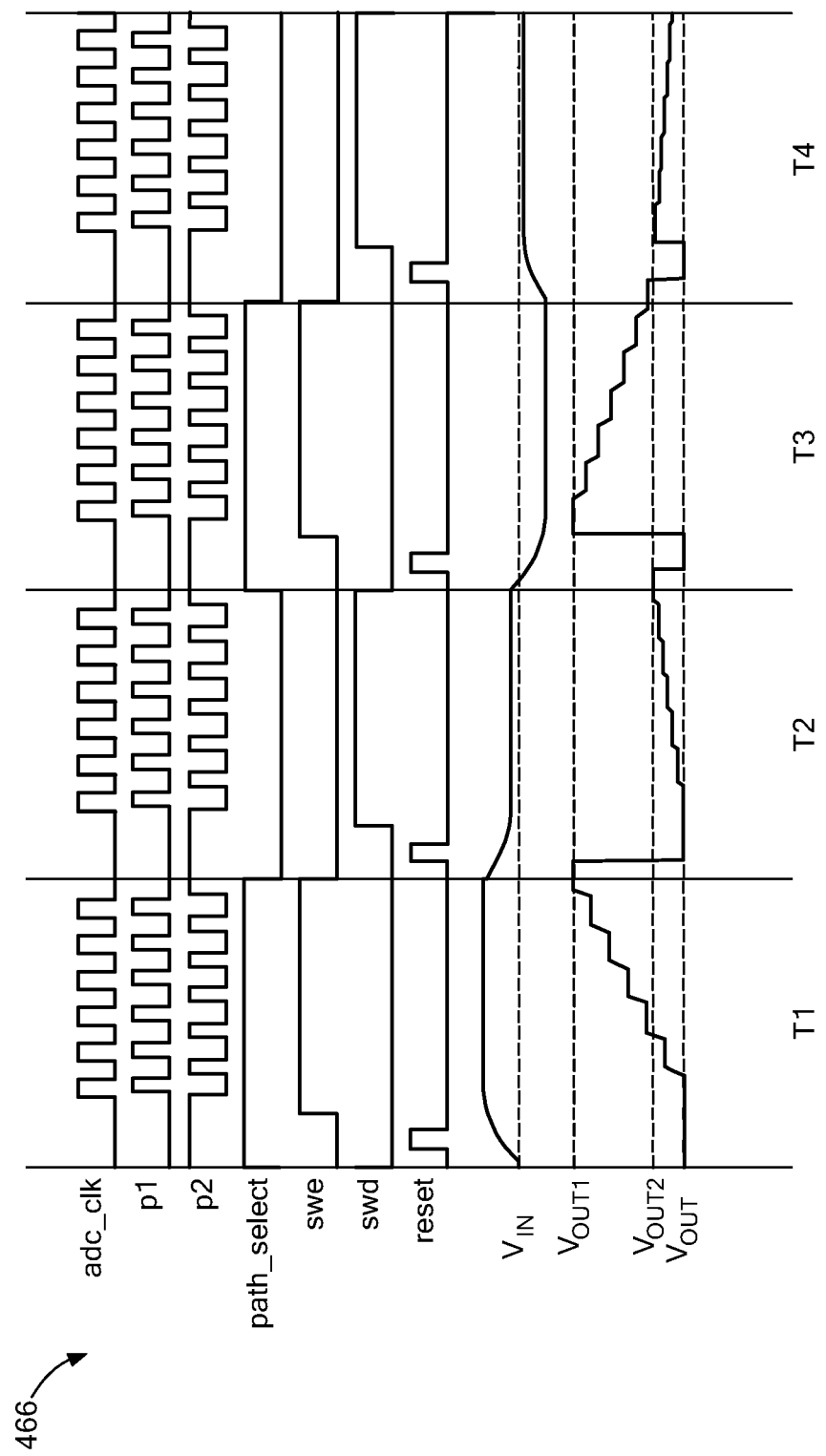
FIG. 9 is a timing diagram of signals related to the integrator circuit of FIG. 8.

Turning to FIG. 9, a timing diagram 466 includes signals associated with integrator circuit 452. Signals p1, p2, swe, and swd described above are shown. The signal labeled $V_{IN}$ may correspond to input signal 453 and the signal labeled $V_{OUT}$ may correspond to output signal 462.

Time periods T1 and T3 correspond to a measured time period during which integrator circuit 452 is processing measured magnetic field signal 204, and time periods T2 and T4 correspond to a reference time period during which integrator circuit 452 is processing reference magnetic field signal 206.

During period T1, signal swe is high so capacitors 454 are coupled to the signal path and signal swd is low so capacitors 456 are decoupled from the signal path. $V_{IN}$, which corresponds to the measured, external magnetic field 106 during time period T1, has a value greater than zero during period T1. As signals p1 and p2 couple and decouple input capacitor 458 to the inverting input of operational amplifier 464, the voltage across capacitors 454 will rise, as shown by the rising value of $V_{OUT}$ during time period T1.

During period T2, signal swe is low so capacitors 454 are decoupled from the signal path and signal swd is high so capacitors 456 are coupled to the signal path. In an embodiment, $V_{OUT}$ initially changes to the previous value stored on capacitors 456, which is zero in this example. $V_{IN}$, which corresponds to the reference magnetic field produced by coil 216 during time period T2, has a value greater than zero during time period T2. However, the amplitude of $V_{IN}$ during time period T2 is shown as lower than the amplitude during time period T1. In an embodiment, the lower amplitude may be due to the reference magnetic field having a relatively lower strength than the measured magnetic field 106. As signals p1 and p2 couple and decouple input capacitor 458 to the inverting input of operational amplifier 464, the voltage across capacitors 456 will rise, as shown by the rising value of $V_{OUT}$ during time period T1. As shown in the figure, $V_{OUT}$ may rise at a slower rate during time period T2 due to the lower signal value $V_{IN}$ during this time period.

During time period T3, when capacitors 454 are once again coupled to the signal path, the $V_{OUT}$ signal jumps to the same voltage level that it had at the end of time period T1. This is because the voltage across capacitors 454 was retained when capacitors 454 were decoupled from the signal path at the end of time period T1.

In time period T3, $V_{IN}$, which corresponds to the measured, external magnetic field 106 during time period T3, has a value less than zero during period T3. Thus, during time period T3, the voltage across capacitors 454 decreases as shown by the decreasing value of the $V_{OUT}$ signal.

During time period T4, when capacitors 456 are once again coupled to the signal path, the $V_{OUT}$ signal jumps to the same voltage level that it had at the end of time period T2. This is because the voltage across capacitors 456 was retained when capacitors 456 were decoupled from the signal path at the end of time period T2.

In time period T4, $V_{IN}$, which corresponds to the reference magnetic field produced by coil 216 during time period T4, has a value less than zero during period T4. Thus, during time period T4, the voltage across capacitors 456 decreases as shown by the decreasing value of the $V_{OUT}$ signal. In this example, the value of $V_{IN}$ may be smaller during T4 than it is when processing the measured, external signal during T3. Thus, the value of the $V_{OUT}$ signal may decrease at a relatively slower rate during T4 than it does during T3.

If the reference magnetic field is being used as a test signal, the voltage level across capacitors 456 (e.g. $V_{OUT}$ during time periods T2 and T4) can be compared to an expected value or expected threshold to generate a diagnostic output signal that can indicate whether a fault is present, for example. If $V_{OUT}$ falls outside of the threshold, a fault signal can be generated. In addition, the voltage level across capacitors 454, which corresponds to the measured magnetic field signal, can be processed to determine position, speed, direction, and other aspects of magnetic target 102.

In an embodiment, the output signal of ADC 222 has a shape and/or value that is the same as or similar to the input signal to the ADC. Filtering the output signal to remove high-frequency components can also shape the output signal so that it more closely resembles the input signal. Thus, the output signal from ADC 222 can be compared to the input signal during the reference time period and. If the output signal deviates from the input signal by a predetermined amount or threshold, then a fault signal can be generated indicating that a fault has been detected. Other methods of generating the fault signal can also be used.

In an embodiment, capacitors 454 and 456 can periodically be swapped, so that capacitors 454 are used to process the reference magnetic field signal 206 during time periods T2 and T4, and capacitors 456 are used to process the measured magnetic field signal 204 during time periods T1 and T2. This can ensure that both sets of capacitors are used at one time or another to process the reference magnetic field signal, so that both sets of capacitors receive test coverage. The sets of capacitors can be swapped according to a predetermined time schedule, in response to a command received by magnetic field sensor 104, or according to any other method that allows the sets of capacitors to be swapped. In an embodiment, control circuit 460 can swap capacitors 454 and 456 by swapping signals swe and swd.

In an embodiment, a reset signal (labeled as 'reset' in FIG. 9) is asserted between each transition between the measured and reference time periods. The reset signal may discharge any parasitic capacitors between each transition, and reduce or eliminate residual signals from the previous time period in order to reduce crosstalk and mixing between the measured and reference magnetic field signals.

Also, at the beginning of each transition between time periods, the clock signal (labeled 'adc_clk') may be paused for a settling time to allow the magnetic field sensors, amplifier, and other circuits time to settle. During this time, inputs and outputs of operational amplifier 464 may be reset and capacitors 454 and 456 may be disconnected, i.e. decoupled from operational amplifier 464. In an embodiment, capacitors 454 and 456 may also be reset if desired at power up or other times, by asserting the reset line while the capacitors are coupled to operational amplifier 464.

After the settling time, signal swe becomes high and the integrator 452 begins operation. Integrator operation includes sampling $V_{IN}$ from capacitor 458 and transferring charge from $C_{IN}$ to capacitor 454 (during the measured time period) or capacitor 456 (during the reference time period). Thus, with each sample, integrator 452 adds a scaled version of the input signal to a previous output voltage level.

After a number of clock cycles, integrator 452 enters the reference time period and processes the reference signal. In an embodiment, the number of clock signals may be chosen to be large enough to allow for the settling time and for oversampling of the signal being processed, and small enough to prevent leakage currents from altering the voltage stored on the capacitor 454 or 456 that is disconnected from operational amplifier 464 and is not being processed. As shown in FIG. 9, the number of clock cycles is six. However, any number of appropriate clock cycles may be chosen.

Signal $V_{OUT}$ may be sampled and stored on capacitor 454 or 456 on the falling edge of the clock adc_clk. At the end of measured time period T1, the magnetic field sensing element may switch from a measured mode as shown in diagram 300 to a reference mode as shown in diagram 302 (See FIG. 3), and the inputs and outputs of operational amplifier 464 may be reset. At the rising edge of the swd signal, capacitor 456 may be coupled to operational amplifier 464 to allow integrator circuit 452 to process the reference magnetic field signal. As noted above, the slower rise in $V_{OUT}$ during time period T2 may be due to a smaller value of the diagnostic signal at $V_{IN}$, which may correspond to the reference magnetic field having a relatively lower strength. At the end of time period T2, integrator 452 may enter measured time period T3 and once again process the measured magnetic field signal 204 in the manner described above. Finally, as shown in FIG. 9, at the end of time period T3, integrator 452 may enter reference time period T4 and once again process the reference magnetic field signal 206 in the manner described above.

Figure 10:
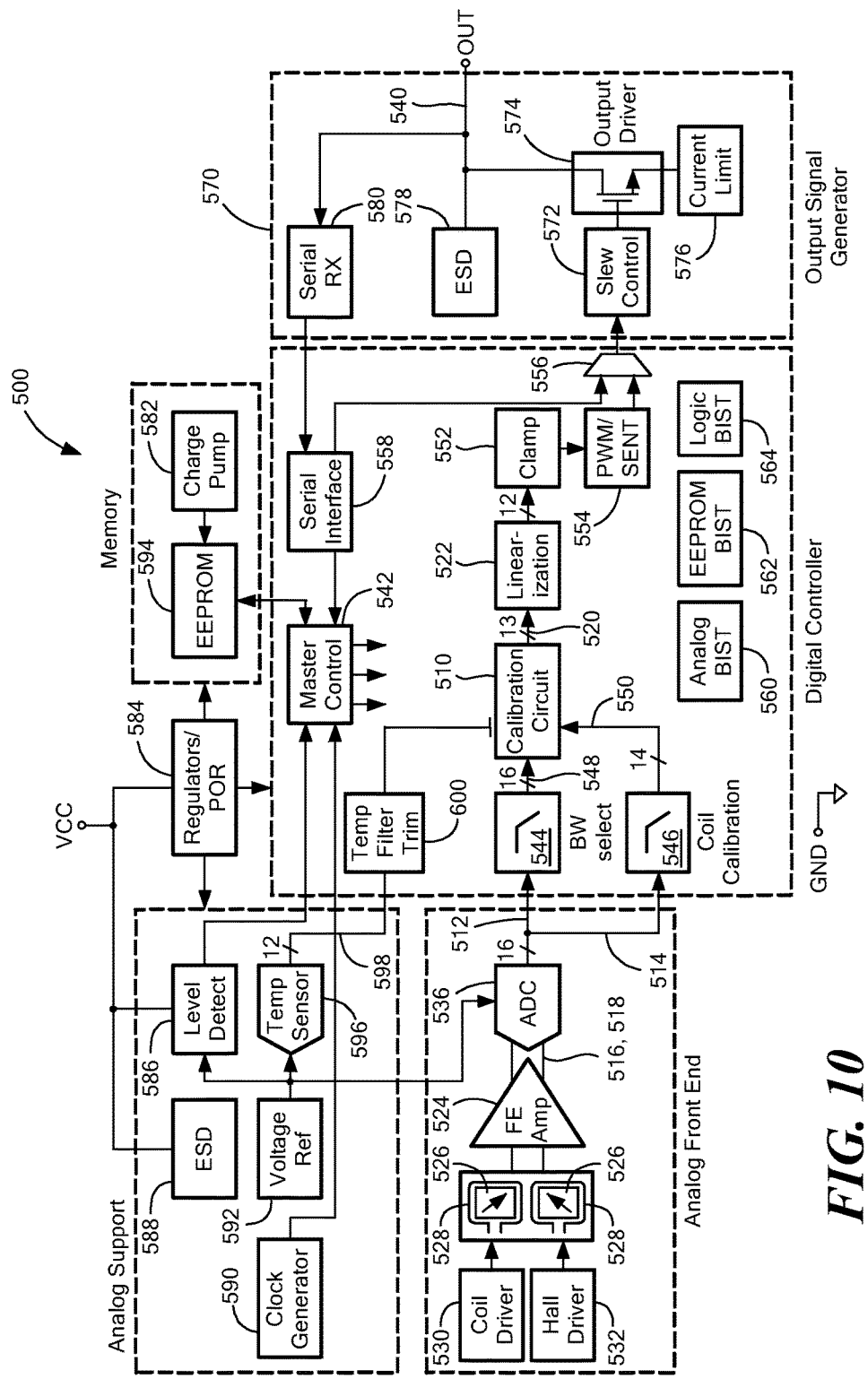
FIG. 10 is a block diagram of the magnetic field sensor including a calibration circuit.

Referring to FIG. 10, a magnetic field sensor 500 includes a calibration circuit 510 that is responsive to a digital measured magnetic field signal 512 and to a digital reference magnetic field signal 514 to generate a calibrated magnetic field signal 520. The calibrated magnetic field signal 520 is further processed to generate an output signal 540 of the sensor that is indicative of the external magnetic field.

The digital measured magnetic field signal 512 and the digital reference magnetic field signal 514 can be the same as or similar to signals 204 and 206 described above and thus, can be generated by switching between an external mode of operation in which a measured magnetic field signal 516 is generated by magnetic field sensing elements 526, such as the illustrated Hall effect elements, under the control of a Hall driver 532 and a reference mode of operation in which a reference magnetic field signal 518 is generated by a reference coil 528 under the control of a coil driver 530. The reference coil 528 is configured to carry a reference current to generate the reference magnetic field. At least one, and in the illustrated embodiment two, magnetic field sensing elements 526 are thus configurable to generate the measured magnetic field signal 516 during a first time period and to generate the reference magnetic field signal 518 during a second, non-overlapping time period.

As described above, the measured magnetic field signal and the reference magnetic field signal may be processed by a Front End (FE) amplifier 524 that may be the same as or similar to amplifier 214 of FIG. 2 and converted into respective digital signals 512, 514 by an analog-to-digital converter 536 using a fixed reference from a voltage reference 592, which converter 536 can be the same as or similar to converter 222 of FIG. 2.

The digital measured magnetic field signal 512 is filtered by a filter 544 to provide a filtered digital measured magnetic field signal 548 (referred to herein alternatively as the digital measured magnetic field signal) and the digital reference magnetic field signal 514 is filtered by a filter 546 to provide a filtered reference magnetic field signal 550 (referred to herein alternatively as the digital reference magnetic field signal). In general, the digital measured magnetic field signal 512 has a larger amplitude than the digital reference magnetic field signal 514 and thus, filter 546 provides a higher degree of filtering than filter 544 to more accurately distinguish the reference magnetic field signal in the presence of noise. Various types of filters are possible. As one example, each of the filters 544, 546 is a decimation low pass FIR filter.

The calibration circuit 510 is configured to combine the digital measured magnetic field signal 548 and the digital reference magnetic field signal 550 in a manner that generates the calibrated magnetic field signal 520 with a reduced or eliminated dependence on certain influences on the magnetic field sensor 500. For example, in the case of an integrated circuit magnetic field sensor 500, certain mechanical stresses on the package due to temperature and humidity variations can cause the sensor output signal 540 to vary from its nominal, trimmed value for a given external magnetic field, thereby adversely affecting the accuracy of the sensor. Operation of the calibration circuit 510 may be controlled by a master control circuit 542 (which additionally may control various other circuit functionality) and will be described in greater detail in connection with FIGS. 11-13. Suffice it to say here that the calibration circuit 510 operates on the digital measured magnetic field signal 548 in a manner dependent on the digital reference magnetic field signal 550 to provide the calibrated signal 520 with a reduced or eliminated dependence on certain adverse influences.

The calibrated magnetic field signal 520 may be processed by a linearization circuit 522 in certain applications. As one example, the calibrated signal 520 may be transformed into a signal representative of a position of a target by correlating values of the calibrated signal to values stored in a lookup table. The output of the linearization circuit 522 may be clamped by a clamp 552 to limit the output to a programmable range and further processed by a PWM/SENT encoder circuit 554 to generate a signal having a PWM format with a programmable frequency or a SENT signal format. A multiplexer 556 can be used to select between providing the output of the PWM/SENT circuit 554 or an output of a serial interface circuit 558 to an output signal generator 570.

Additional elements of the magnetic field sensor 500 can include an analog Built-in-Self-Test (BIST) circuit 560 as may implement the above-described techniques for diagnostic signal processing to detect errors in the analog front end of the sensor, an EEPROM BIST circuit 562 to test the EEPROM 594, and a logic BIST circuit 564 to test various logic functionality on the sensor IC 500.

The output signal generator 570 is coupled to the multiplexer 556 and includes various elements used to reliably generate the sensor output signal 540 indicative of the external magnetic field, such as a slew control circuit 572, an output driver 574, a current limit circuit 576, an ESD protection device 578, and a serial Receiver (RX) circuit 580. In applications in which the output signal 540 is provided in the SENT signal format, the serial receiver 580 may implement bidirectional communication as described in a U.S. Pat. No. 8,577,634, entitled "Systems and Methods for Synchronizing Sensor Data" which is assigned to the assignee of the present disclosure and incorporated herein by reference in its entirety. The sensor 500 may further include additional supporting elements such as an EEPROM 594, a charge pump 582, a regulator and Power On Reset (POR) circuit 584, a level detector 586, an ESD protection device 588 and, a clock generator 590.

A temperature sensor 596 senses the ambient temperature to which the sensor is subjected, converts the sensed temperature into a digital signal, and provides the digital sensed temperature signal 598 to a temperature filter and trim circuit 600 for further coupling to the calibration circuit 510 as described below.

While the sensor 500 may be provided in the form of an integrated circuit with an analog front end portion and a digital portion, it will be appreciated that the particular delineation of which circuit functions are implemented in an analog fashion or with digital circuitry and signals can be varied. Further, some of the illustrated circuit functions can be implemented on an integrated circuit sensor 500 and other circuitry and functionality can be implemented on separate circuits (e.g., additional substrates within the same integrated circuit package, or additional integrated circuit packages, and/or on circuit boards).

Figure 11:
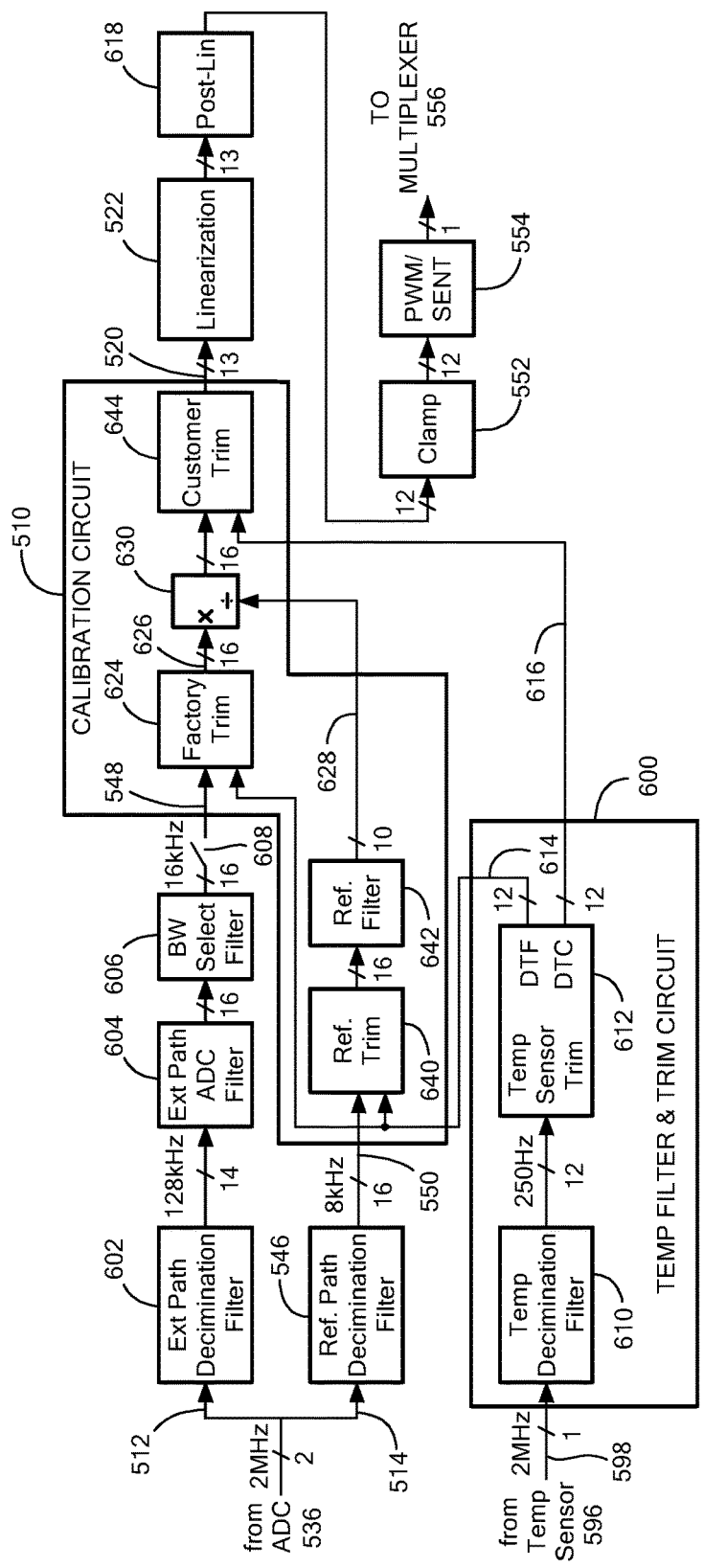
FIG. 11 is a block diagram of the controller of FIG. 10.

Referring also to FIG. 11 in which like elements are labeled with like reference characters, the calibration circuit 510 and certain other elements of the sensor of FIG. 10 are shown. In particular, the filter 544 (FIG. 10) that operates to filter the digital measured magnetic field signal 512 to provide the filtered digital measured magnetic field signal 548 is here shown to include a decimation filter 602, an ADC filter 604, and a bandwidth select filter 606, each providing low-pass filtering to reduce noise. In an embodiment, filter 602 decimates a 2 MHz ADC signal to 128 kHz and provides some low-pass filtering. Slower (i.e., 128 kHz) processing consumes less power and silicon area. Filter 604 provides additional low-pass filtering beyond what is feasible with the decimation filter 602 and filter 606 provides additional low-pass filtering that is selectable by the customer in order to permit a trade-off to be made between noise performance and response time. The reference path filter 546 (FIG. 10) that operates to filter the digital reference magnetic field signal 514 to provide the filtered digital reference magnetic field signal 550 may be a decimation filter. The output of the bandwidth select filter 606 provides the filtered digital measured magnetic field signal 548 and is shown to be coupled to the calibration circuit 510 through a switch 608. The switch 608 illustrates that in some embodiments, sampling of the signal 548 may be at a predetermined sample rate, such as the illustrated 16 kHz, or alternatively may be at a different rate such as in response to an external trigger signal as described in the above-referenced U.S. Pat. No. 8,577,634, for example.

The temperature filter and trim circuit 600 is here shown to include a temperature decimation filter 610 and a temperature sensor trim circuit 612. The temperature sensor trim circuit 612 provides a trimmed factory temperature signal 614 for use by a factory trim circuit 624 and a reference trim circuit 640. The temperature sensor trim circuit also provides a trimmed customer temperature signal 616 for use by a customer trim circuit 644. Various schemes are possible to trimming the temperature signal 598.

A post-linearization circuit 618 can be coupled between the linearization circuit 522 to introduce additional gain and offset trim, as may be useful to attenuate the signal to maintain usage of all linearization points when using an output range that is not full-scale for example.

The calibration circuit 510 receives the digital measured magnetic field signal 548, the digital reference magnetic field signal 550, and the trimmed temperature signals 614, 616 and generates the calibrated signal 520, as shown. More particularly, the calibration circuit 510 includes factory trim circuit 624 (referred to alternatively as a manufacturing trim circuit) that receives the digital measured magnetic field signal 548 and the trimmed temperature signal 614 and is configured to adjust at least one of a gain or an offset of the digital measured magnetic field signal based on a sensed temperature (i.e., based on the trimmed temperature signal 614). More particularly, the factory trim circuit 624 corrects for analog front end gain and offset variations due to temperature, such as by adding a temperature-dependent offset and multiplying by a temperature-dependent gain factor, which factors may be programmed during a manufacturing test process. The factory trim circuit 624 may additionally correct for temperature-independent offset and gain errors in the analog front end signal path. Programmable trim values associated with the factory trim circuit and any other trim circuits can be programmed into EEPROM locations 594.

The calibration circuit 510 further includes a reference trim circuit 640 that receives the digital reference magnetic field signal 550 and the trimmed temperature signal 614 and provides a trimmed reference magnetic field signal to a reference filter 642.

The reference trim circuit 640 is configured to adjust a gain of the reference magnetic field signal 550. In one embodiment, the reference trim circuit 640 adjusts a gain of the digital reference magnetic field signal based on a predetermined scale factor to facilitate signal processing by a combining circuit 630, as will be described. The reference trim circuit 640 may further adjust at least one of the gain or an offset of the digital reference magnetic field signal based on a sensed temperature (i.e., based on trimmed temperature signal 614) in a manner that is the same as or similar to the factory trim circuit 624. For example, the reference trim circuit 640 may correct for analog front end gain and offset variations due to temperature by adding a temperature-dependent offset and multiplying by a temperature-dependent gain factor, which factors may be programmed during a manufacturing test process. The reference trim circuit 640 may additionally correct for temperature-independent offset and gain errors in the analog front end signal path. Again, programmable trim values can be programmed into EEPROM locations 594.

The combining circuit 630 is configured to combine the digital measured magnetic field signal 548 and the digital reference magnetic field signal 550 and, more particularly, may operate to combine the trimmed version of these signals as labeled 626, 628, respectively, as shown. In an embodiment general, the combining circuit 630 divides the measured magnetic field signal 626 by the reference magnetic field signal 628. The division operation can be accomplished in various ways. In the illustrative embodiment, a Taylor series expansion is used as will be described.

The output of the combining circuit 630 may be further trimmed by a customer trim circuit 644 in order to generate the calibrated magnetic field signal 520. The customer trim circuit 644 may be divided into a sensitivity trim portion which multiplies the input signal by a user programmable temperature-dependent gain factor and an offset portion that adds to its input a user programmable offset that is linearly dependent on temperature as a function of magnetic field strengths and offsets in the customer's application. Further processing of the calibrated signal 520 may be performed by linearization circuit 522, post-linearization circuit 618, clamp 552 and PWM/SENT encoder 554 (FIG. 10).

Figure 12:
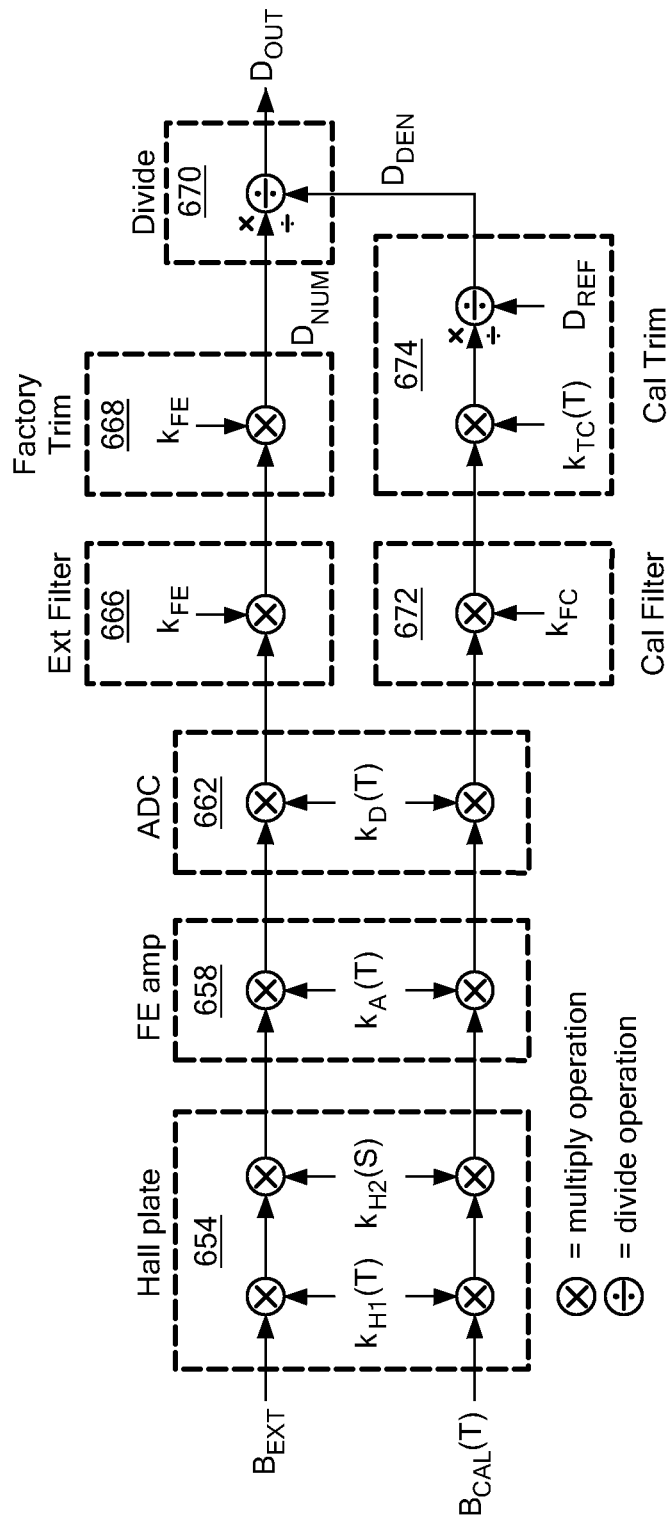
FIG. 12 is block diagram illustrating a mathematical model of the magnetic field sensor of FIG. 10.

Referring also to FIG. 12, a model of the magnetic field sensor 500 (FIGS. 10 and 11) is shown to illustrate the principle of operation of the combining circuit 630. As explained above, much of the sensor circuitry is shared between sensing and processing a magnetic field signal based on an external magnetic field $B_{EXT}$ and sensing and processing a magnetic field signal based on a reference magnetic field $B_{CAL}$; however, for simplicity of explanation, these two signal processing functions are shown in the model of FIG. 12 as being separate signal paths.

The one or more magnetic field sensing elements 526 (FIG. 10) are represented by model block 654 as being responsive to an external magnetic field $B_{EXT}$ and a reference magnetic field $B_{CAL}$ as may be provided by a reference coil 528 (FIG. 10) for example. The reference magnetic field $B_{CAL}$ is modeled as a function of temperature (T) because it is generated by temperature-sensitive components. The magnetic field sensing element is modeled with a temperature-dependent sensitivity $k_{H1}(T)$ and a stress-dependent sensitivity multiplier of $k_{H2}(S)$, where "S" represents mechanical stress. Here, $k_{H2}(S)$ represents the percentage change in nominal sensing element sensitivity $k_{H2}$ due to stress, which is typically less than 3%. In other words, typically $0.97 < k_{H2}(S) < 1.03$.

The amplifier 524 and analog-to-digital converter 536 (FIG. 10) are modeled by respective blocks 658 and 662, each having a temperature-dependent gain $k_A(T)$ and $k_D(T)$, respectively. The external filter 544 (FIG. 10) and the reference filter 546 (FIG. 10) are modeled by respective blocks 666 and 672, each having a temperature-independent gain parameter $k_{FE}$ and $k_{FC}$, respectively.

The factory trim circuit 624 (FIG. 11) is modeled by a block 668 as having a temperature dependent gain $k_{TE}(T)$. The reference trim circuit 640 (FIG. 11) is modeled by a block 674 and includes a temperature dependent gain term $k_{TC}(T)$. Block 674 includes an additional term $D_{REF}$ to represent a gain adjustment by a predetermined reference value, or scale factor used to facilitate operation of the combining circuit 630 (FIG. 11). Reference value $D_{REF}$ may be chosen to be an exponent of two to facilitate a simple division operation (i.e., a bit-shift operation) by the reference trim circuit 640.

The combining circuit 630 (FIG. 11) is modeled by a block 670 and is shown to compute $D_{OUT}$, the quotient of the measured magnetic field signal 626 and the reference magnetic field signal 628, for further signal processing. $D_{OUT} = D_{NUM}/D_{DEN}$ can be represented as:

$$= \frac{k_{FE} \cdot k_{H1}(T) \cdot k_A(T) \cdot k_D(T) \cdot k_{TE}(T) \cdot k_{H2}(S) \cdot B_{EXT}}{k_{FC} \cdot k_{H1}(T) \cdot k_A(T) \cdot k_D(T) \cdot k_{TC}(T) \cdot k_{H2}(S) \cdot B_{EXT}(T)/D_{REF}} \quad (1)$$

As noted above, the trim circuits 624, 640 are designed to reduce or remove the temperature dependence of the output signal. Accordingly, the $k_{TE}(T)$ and $k_{TC}(T)$ can be chosen so that:

$$k_{TE}(T) \approx k_{NOM} \cdot [k_{FE} \cdot k_{H1}(T) \cdot k_A(T) \cdot k_D(T)]^{-1} \quad (2)$$

$$k_{TC}(T) \approx D_{REF} \cdot [k_{FC} \cdot k_{H1}(T) \cdot k_A(T) \cdot k_D(T) \cdot B_{EXT}(T)]^{-1} \quad (3)$$

where $k_{NOM}$ is the nominal, or desired, sensitivity of the sensor, independent of temperature and stress. More particularly, $k_{NOM}$ defines how many LSBs the device output should change by in the presence of an input magnetic field change of 1 Gauss. According to equation (2), if the combined effect of the front-end parameters (which may be measured during manufacture) is known, then $k_{TE}$ (as a function of temperature) can be selected to make the sensitivity become $k_{NOM}$, as desired. A similar methodology can be used to select $k_{TC}$. Substituting the latter expressions into the former and solving for $D_{OUT}$ gives:

$$D_{OUT} = \frac{D_{NUM}}{D_{DEN}} \quad (4)$$
$$\approx \frac{k_{NOM} \cdot k_{H2}(S) \cdot B_{EXT}}{k_{H2}(S)}$$
$$= k_{NOM} \cdot B_{EXT}$$

Thus, it will be appreciated that $D_{OUT}$ becomes the desired response, with desired sensitivity $k_{NOM}$, independent of temperature (T) and stress (S).

The model of FIG. 12 includes only operations that adjust the gain of the measured and reference signals. Temperature-dependent offsets also exist in the system, both as generated by inaccurate analog circuit components and as included for compensating for inaccurate analog circuit components by factory and reference trim blocks. These effects are not included in the model to simplify the above analysis. It will be appreciated that these offset errors can be cancelled in a similar way to the sensitivity error cancellations shown in Equations (2) through (4) above, resulting in a sensor output signal $D_{OUT}$ that remains independent of stress effects.

The division operation performed by the combining circuit 630 (FIG. 11) can be simplified by forcing the divisor to be numerically close to one (e.g., within about 3%) as is achieved by the reference trim circuit 640 adjusting the gain of the reference magnetic field signal by the predetermined scale factor $D_{REF}$. In particular, in one embodiment, the combining circuit 630 performs a division operation using a Taylor series expansion that can be represented as follows:

$$D_{OUT} = \frac{D_{NUM}}{D_{DEN}} \quad (5)$$
$$\approx \frac{D_{NUM}}{1-(1-D_{DEN})}$$
$$= D_{NUM} \cdot [1 + (1-D_{DEN}) + (1-D_{DEN})^2 + (1-D_{DEN})^3 + \cdots]$$

This expansion can be approximated with only a few terms if $(1-D_{DEN})$ is numerically small relative to one. This is indeed the case, as $1-D_{DEN}=1-k_{H2}(S)$, which represents the percentage change of the Hall plate sensitivity due to stress, is typically less than 0.03 (3%) in magnitude, in other words, $-0.03 < 1-k_{H2}(S) < +0.03$.

In particular, the division operation can be expressed with sufficient accuracy for most applications by using only three terms as follows:

$$D_{OUT} \approx D_{NUM}[1+(1-D_{DEN})+(1-D_{DEN})^2+(1-D_{DEN})^3] \quad (6)$$

$$D_{OUT} \approx D_{NUM}[1+X \cdot (1+X \cdot (1+X))]$$

where $X=(1-D_{DEN})$. This simplification is possible because the reference trim circuit 640 forces $D_{DEN} \approx 1$, thereby ensuring that the three terms used in the Taylor series approximation provide a resulting calibrated signal 520 that is accurate enough to track small changes in $D_{DEN}$ due to stresses.

Figure 13:
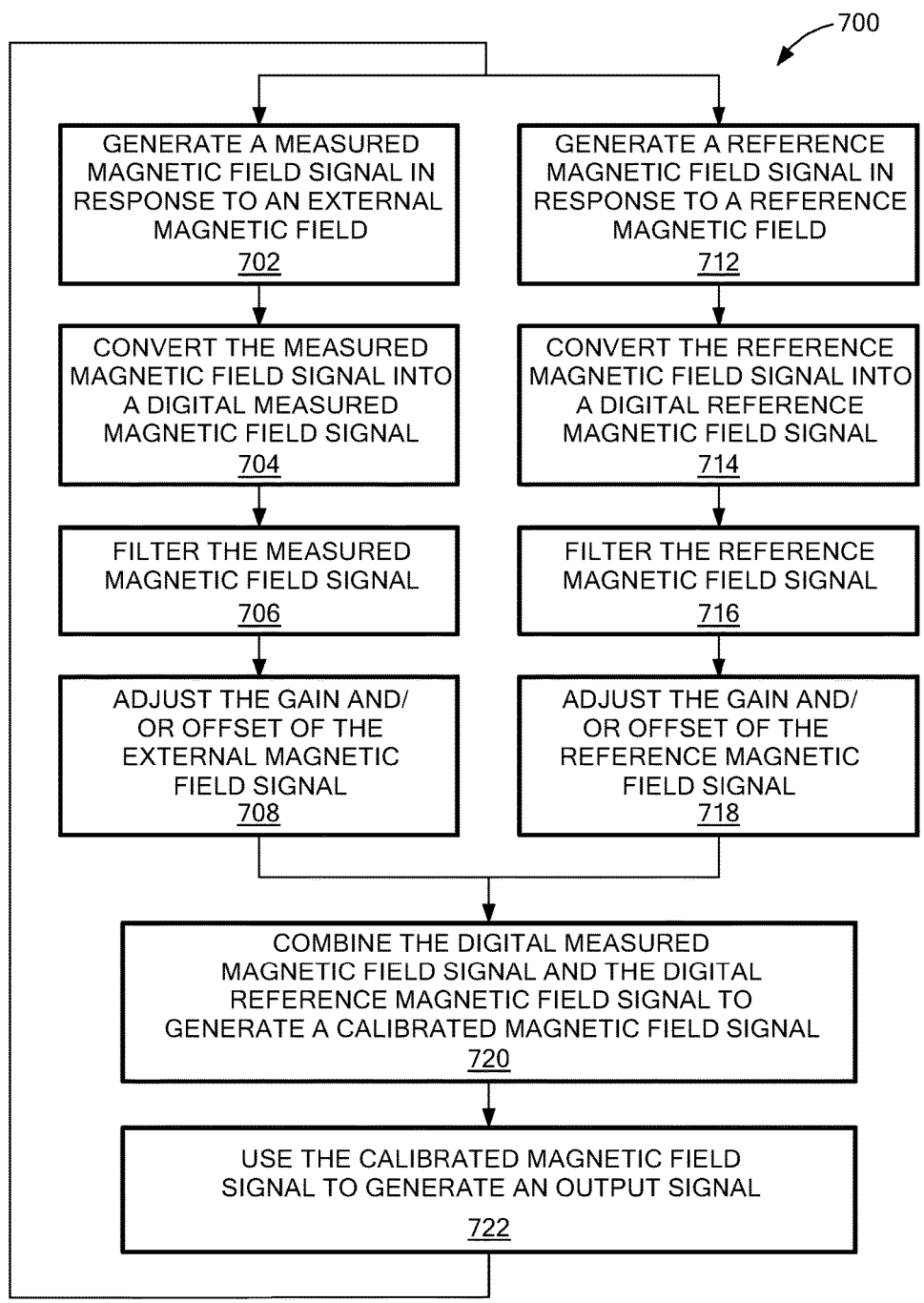
FIG. 13 is a flow diagram illustrating a calibration process of the magnetic field sensor of FIG. 10.

In one embodiment, the computation represented by equation (6) can be implemented with a single shared multiplier, used three times. FIG. 13 shows a flowchart illustrating a process for implementing the magnetic field sensor 500 (FIGS. 10 and 11) to calibrate a measured magnetic field signal. Rectangular elements, herein denoted "processing blocks," represent computer software instructions or groups of instructions. Diamond shaped elements, herein denoted "decision blocks," represent computer software instructions, or groups of instructions, which affect the execution of the computer software instructions represented by the processing blocks. Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated file blocks described below are unordered meaning that, when possible, the steps can be performed in any convenient or desirable order.

The process 700 commences with a measured magnetic field signal (e.g., signal 516 of FIG. 10) being generated in response to an external magnetic field at block 702, as may be achieved with the Hall effect elements 526 configured to respond only to an external magnetic field. A reference magnetic field signal (e.g., signal 518 of FIG. 10) is generated in response to a reference magnetic field at block 712, as may also be achieved with the Hall effect elements 526 configured to respond to reference magnetic field such as the reference magnetic field generated by reference coil 528. With the above-described configuration, the magnetic field sensing elements 526 are configured to generate the measured magnetic field signal 516 during a first timer period and to generate the reference magnetic field signal 518 during a second, non-overlapping time period.

The measured and reference magnetic field signals are converted to digital signals (e.g., signals 512, 514 of FIG. 10) in process blocks 704 and 714, respectively, as may be achieved with the analog-to-digital converter 536 (FIG. 10), and the measured and reference magnetic field signals may be filtered in blocks 706, 716, respectively, by filters 544, 546 (e.g., to provide signals 548, 550 of FIG. 10). In process block 708, at least one of a gain or offset of the external magnetic field signal 548 may be adjusted, such as by factory trim circuit 624 (FIG. 11). In process block 718, a gain of the reference magnetic field signal 550 may be adjusted by a predetermined scale factor and also or alternatively a gain or offset of the reference magnetic field signal 550 may be adjusted, such as by reference trim circuit 640 (FIG. 11). The digital measured magnetic field signal 626 and the digital reference magnetic field signal 628 are combined to generate a calibrated magnetic field signal in block 720, such as may be achieved by combining circuit 630 (FIG. 11). Accordingly, in one embodiment, the digital measured magnetic field signal 626 is divided by the digital reference magnetic field signal 628. It will be appreciated that other schemes for combining the digital measured magnetic field signal 626 and the digital reference magnetic field signal 628 may be possible in order to still achieve the reduction or elimination of stress influences on the generated calibrated signal. As an example, simple addition and/or subtraction can be used. That is, taking an example where the reference signal 628 is 2% greater than its expected value, the 2% can be subtracted from the measured signal 626. In process block 722, the calibrated magnetic field signal (e.g., signal 520 in FIG. 10) is used to generate the sensor output signal (e.g., signal 540 in FIG. 10).

The calibration process 700 may be performed at any time since the related circuitry and processing is integrated within the sensor 500 (e.g., on an integrated circuit sensor 500). Furthermore, the process steps may be performed together or in stages. For example, some portions of the signal processing may be performed during the manufacturing process (e.g., processing performed by the factory trim circuit 624, the customer trim circuit 644, the reference trim circuit 640, and/or the temperature sensor trim circuit 612) while other signal processing (e.g., the signal combining by combining circuit 630) may be performed periodically or in response to a command signal during use of the sensor after it is installed in the intended environment.

It will be appreciated that processing blocks illustrated in FIG. 13 may occur simultaneously rather than sequentially and that the illustrated sequence can be varied in many instances. As one example, while the calibration circuit 510 (FIGS. 10 and 11) is shown to process the measured and reference magnetic field signals in the digital domain (after the analog-to-digital conversion by converter 536, it will be appreciated that the same calibration concepts can be applied in the analog domain. For example, the division performed by the combining circuit 630 alternatively could be performed in the analog domain with the use of an analog-to-digital converter that has as its input the measured magnetic field signal 516 (FIG. 10) and as its reference the reference magnetic field signal 518. In such embodiments, it will be appreciated the analog-to-digital conversion blocks 704, 714 in FIG. 13 can occur later in the process, after the measured magnetic field signal is divided by the reference magnetic field signal.

Figure 14:
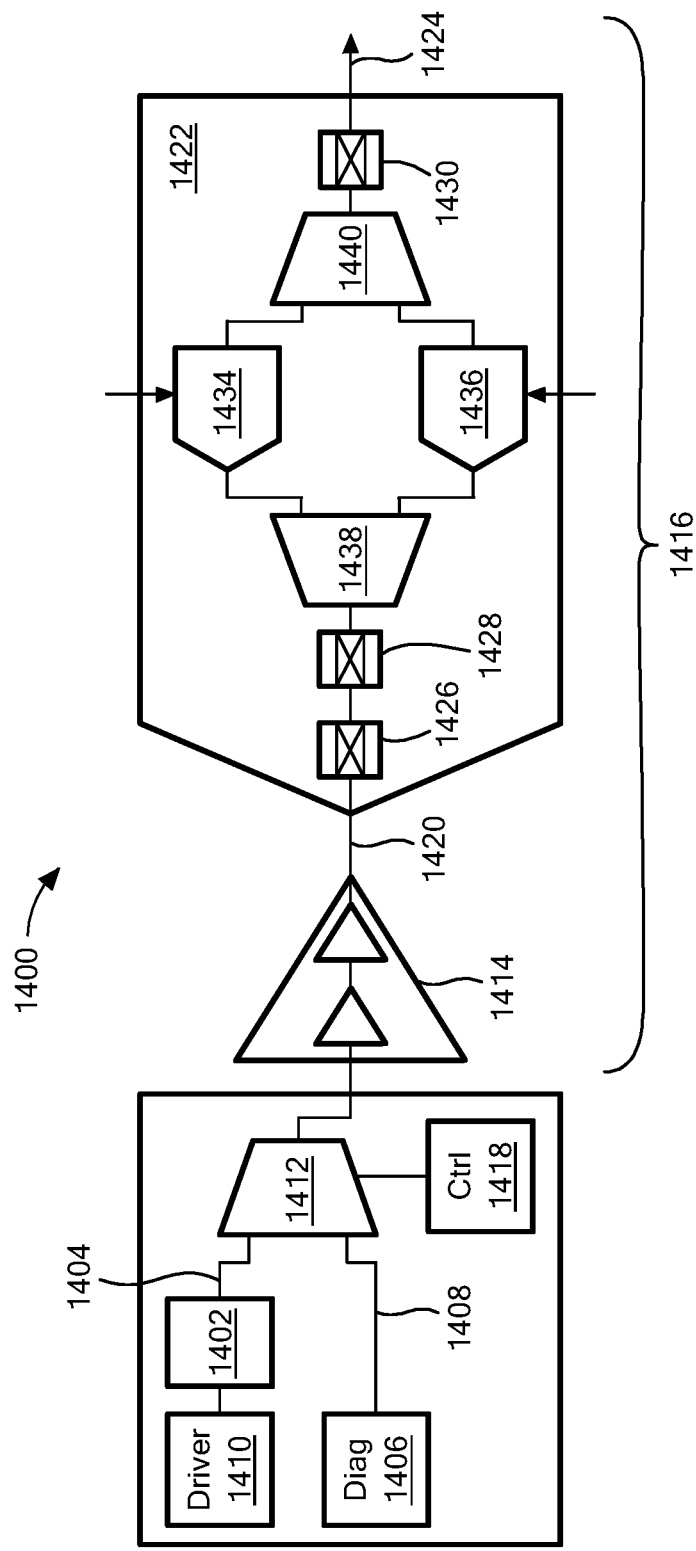
FIG. 14 is a block diagram of a magnetic field sensor including an amplifier, a dual-path analog-to-digital converter, and a diagnostic circuit.

Referring now to FIG. 14, circuit 1400 may be included in or as part of a magnetic field sensor system. Circuit 1400 may be configured to detect a magnetic field (such as magnetic field 106 in FIG. 1) and process signals representing the detected magnetic field. For example, magnetic field sensing element(s) 1402 may detect the magnetic field and produce signal 1404 representing the detected magnetic field.

Circuit 1400 may include a diagnostic circuit 1406 to generate a diagnostic signal 1408. Circuit 1400 may perform self-tests by, for example, processing diagnostic signal 1408 and comparing the processed signals to an expected value. The diagnostic signal 1408 may be a DC signal, a periodic signal, or any other signal that may produce an expected result when processed by circuit 1400.

Circuit 1400 includes one or more so-called signal paths, which is a path through circuit 1400 over which a signal is propagated while the signal is being processed. In the example shown in FIG. 14, the signal path may include amplifier 1414 (which may be the same as or similar to amplifier 214), ADC 1422 (which may be the same as or similar to ADC 222), and/or any other circuits that process signal 1404 and/or 1408. For example, signal 1404 may be generated by magnetic field sensing element(s) 1402, then propagated to amplifier 1414, then propagated to ADC 1422 and through either converter circuit 1434 or 1436, and then finally propagated to an output of ADC 1422 as signal 1424. In general, the term signal path may refer to an electronic path, through one or more circuits, though which a signal travels. The term signal path may be used to describe an entire path or a portion of a path through which the signal travels.

In an embodiment, circuit 1400 includes one or more magnetic field sensing elements 1402 configured to measure an external magnetic field (such as magnetic field 106) and generate a measured magnetic field signal 1404 that is responsive to the external magnetic field.

A driver circuit 1410 may provide electrical power to magnetic field sensing element(s) 1402, which may allow magnetic field sensing element(s) 1402 to detect the external magnetic field and produce signal 1404.

Circuit 1400 may also include a switch 1412 that can selectively couple signal 1404 and signal 1408 to the signal path 1416. The switch may be a multiplexor, a transistor, or any other type of switch that can selectively couple signal 1404 and signal 1408 to the signal path 1416.

Control circuit 1418 may contain logic to control switch 1412. Control circuit 1418 may be configured to couple signal 1404 to signal path 1416 during a measured time period and couple signal 1408 to signal path 1416 during a diagnostic time period. Although not shown, control circuit 1418 may also be coupled to converter circuits 1434 and 1436, and to switches 1438 and 1440, and/or to other circuit elements, to control analog-to-digital conversion of signals 1404 and 1408 during the different time periods.

In embodiments, control circuit 1418 may effectuate a time-multiplexed scheme for processing signals 1404 and 1408. For example, during a first time period, control circuit 1418 may control switch 1412 so that signal 1404 is directed to signal path 1416. During this time period, control circuit 1418 may control switches 1438 and 1440 so that the signal is directed to converter circuit 1434. Also, during this time period, control circuit 1418 may enable converter circuit 1434 and disable converter circuit 1436.

During a second time period, control circuit 1418 may control switch 1412 so that diagnostic signal 1408 is directed to signal path 1416. During the second time period, control circuit 1418 may control switches 1438 and 1440 so that the signal is directed to converter circuit 1436. Also, during this time period, control circuit 1418 may enable converter circuit 1436 and disable converter circuit 1434.

Circuit 1400 may also include other circuits, which may or may not be shown, such as, amplifiers, filters, and/or other mechanisms or circuits to process signal 1404 and 1408. An example of a chopping circuit is described in U.S. patent application Ser. No. 13/398,127 (filed Feb. 16, 2012), which is incorporated here by reference in its entirety.

Amplifier 1414 may be configured to receive and amplify magnetic field signal 1404 during the measured time period, and to receive and amplify diagnostic signal 1408 during the diagnostic time period. In an embodiment, signals 1404 and 1408 are differential signals and amplifier 1414 is a differential amplifier. In other embodiments, signals 1404 and 1408 are single-ended signals and amplifier 1414 is a single-ended signal Amplifier.

The output of amplifier 1414 (i.e. amplified signal 1420) may be an analog signal in certain embodiments. Thus, circuit 1400 may include an analog-to-digital converter ("ADC") circuit 1422 coupled to receive amplified signal 1420 and convert it to a digital signal 1424. Because amplifier 1414 receives signal 1404 during a measured time period, and receives diagnostic signal 1408 during a diagnostic time period, amplified signal 1420 may represent both signals at different times—it may represent measured magnetic field signal 1404 during the measured time period and may represent reference magnetic field signal 1408 during the reference time period.

ADC 1422, which may be the same as or similar to ADC 222, may be referred to here as a so-called dual-path ADC because ADC 1422 may have some shared circuit portions that process both measured magnetic field signal 1404 and reference magnetic field signal 1408, and may have other dedicated circuit portions that are configured to process either measured magnetic field signal 1404 or reference magnetic field signal 1408. For example, chopping circuits 1426, 1428, and 1430 may be shared circuit portions that are configured to process both signals 1404 and 1408. In contrast, converter circuit 1434 may be configured to process measured magnetic field signal 1404 while converter circuit 1436 may be configured to process diagnostic signal 1408. ADC 1422 may include multiplexors 1438 and 1440, or other switching circuits, that can selectively couple and de-couple converter circuits 1434 and 1436 from the other circuits included in ADC 1422 so that converter circuit 1434 processes measured signal 1404 during the measured time period and converter circuit 1436 processes diagnostic signal 1408 during the reference time period.

In an embodiment, converter circuit 1434 comprises one or more capacitors that are included in an integrator circuit, and converter circuit 1436 comprises one or more capacitors that are included in the same integrator circuit. Like ADC 222 discussed above, ADC 1422 may include one or more integrator circuits each having at least two sets of one or more capacitors each: a first set for processing measured signal 1404 and a second set for processing diagnostic signal 1408.

Periodically, the sets of capacitors can be swapped so that the first set of capacitors processes the diagnostic signal 1408 and the second set of capacitors processes measured signal 1404. Because signal 1408 may be a test signal, swapping the capacitors can allow both sets of capacitors to process the test signal and receive test coverage.

In operation, the measured time period and the diagnostic time period are alternating, non-overlapping time periods, and circuit 1400 processes measured magnetic field signal 1404 and diagnostic signal 1408 in a time-division multiplexed ("TDM") manner. For example, during the measured time period, switch 1412 may be configured to propagate measured signal 1404 through to amplifier 1414, and multiplexors 1438 and 1440 may be configured to couple converter circuit 1434 to the signal path 1416 and decouple converter circuit 1436 from the signal path. During the diagnostic time period, switch 1412 may be configured to propagate diagnostic signal 1408 through to amplifier 1414, and multiplexors 1438 and 1440 may be configured to couple converter circuit 1436 to the signal path 1416 and decouple converter circuit 1436 from the signal path 1416.

In an embodiment, converter circuits 1434 and 1436 can be swapped, as described above, after a predetermined number of time periods. Because signal 1408 may be a test signal, this will allow both converter circuits to be tested because, by swapping them, they will each be exposed to and each process the test signal. Converter circuits 1434 and 1436 may also be swapped in response to a command received by the magnetic field sensor from computer 108, or in response to any other schedule or trigger.

Diagnostic signal 1408 may have a known, expected value. Thus, during the diagnostic time period, amplified signal 1420 and digital signal 1424, which are ultimately derived from diagnostic signal 1408 during the diagnostic time period, may also have expected values. These expected values can be compared to predetermined test values to determine if there is a fault in circuit 1400. Test coverage in circuit 1400 may be increased because most of the circuitry, including amplifier 1414, are shared circuits that process both the measured signal 1404 and the diagnostic signal 1408. Using the test circuitry to process both signals increases accuracy and coverage of the test results.

Variations in silicon circuit fabrication can limit the accuracy of the measurement of diagnostic signal 1408. As an example, variations in Hall plate fabrication (e.g., thickness of silicon doping, alignment of optical masks, etc.) may cause variations in Hall plate sensitivity. As another example, variations in resistor fabrication (e.g., impurity atoms in the silicon material) may cause variations, as a function of temperature for example, in the coil current used to generate the reference field. Both variations can cause the diagnostic signal 1408 to stray from its expected value. It can be difficult to determine if this is due to variation in the fabrication process or is due to a failure in the device. Therefore, after fabrication, the gain and/or offset of the diagnostic signal 1408 can be trimmed (i.e. adjusted), as a function of temperature, so that it matches its expected value. In an embodiment, adjusting the gain and offset after fabrication includes setting or configuring a trimming circuit to perform the desired gain and/or offset of the signal 1408. Errors in the diagnostic signal measurement detected after factory trim are then detected as circuit failures rather than variations due to silicon fabrication.

Circuit 1400 may also include a trim circuit and a temperature sensor circuit (not shown) to sense the temperature of circuit 1400 and adjust the gain and offset of measured signal 1404 and/or diagnostic signal 1408. The amount of gain and offset adjustment performed by the trim circuit may be based on the temperature measured by a temperature sensor circuit.

Figure 15:
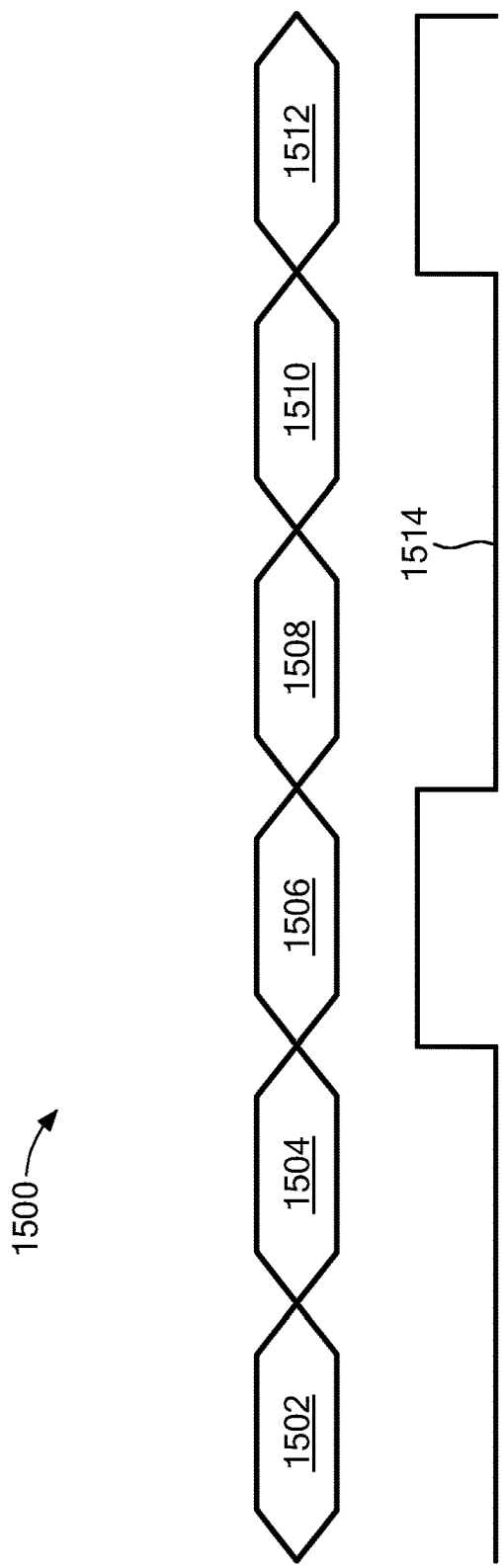
FIG. 15 is a timing diagram of signals and states related to the magnetic field sensor of FIG. 14.

Referring to FIG. 15, timing diagram 1500 illustrates states of circuit 1400 during alternating measured and diagnostic time periods. In timing diagram 1500, the horizontal axis represents time, and time period block 1502-1512 represents a measured time period or a diagnostic time period. Signal 1514 represents a control signal (for example a signal produced by control circuit 1418). In this example, when signal 1514 is low, circuit 1400 may process measured signal 1404 and, when signal 1514 is high, circuit 1400 may process diagnostic signal 1408. Thus, time period blocks 1502, 1504, 1508, and 1510 may represent measured time periods and time period blocks 1506 and 1508 may represent diagnostic time period blocks.

In this example, two adjacent measured time periods (e.g. time periods 1502 and 1504) precede each diagnostic time period (e.g. time period 1506). However, in other arrangements any number of adjacent measured time periods may precede (or follow) any number of adjacent diagnostic time periods.

Figure 16:
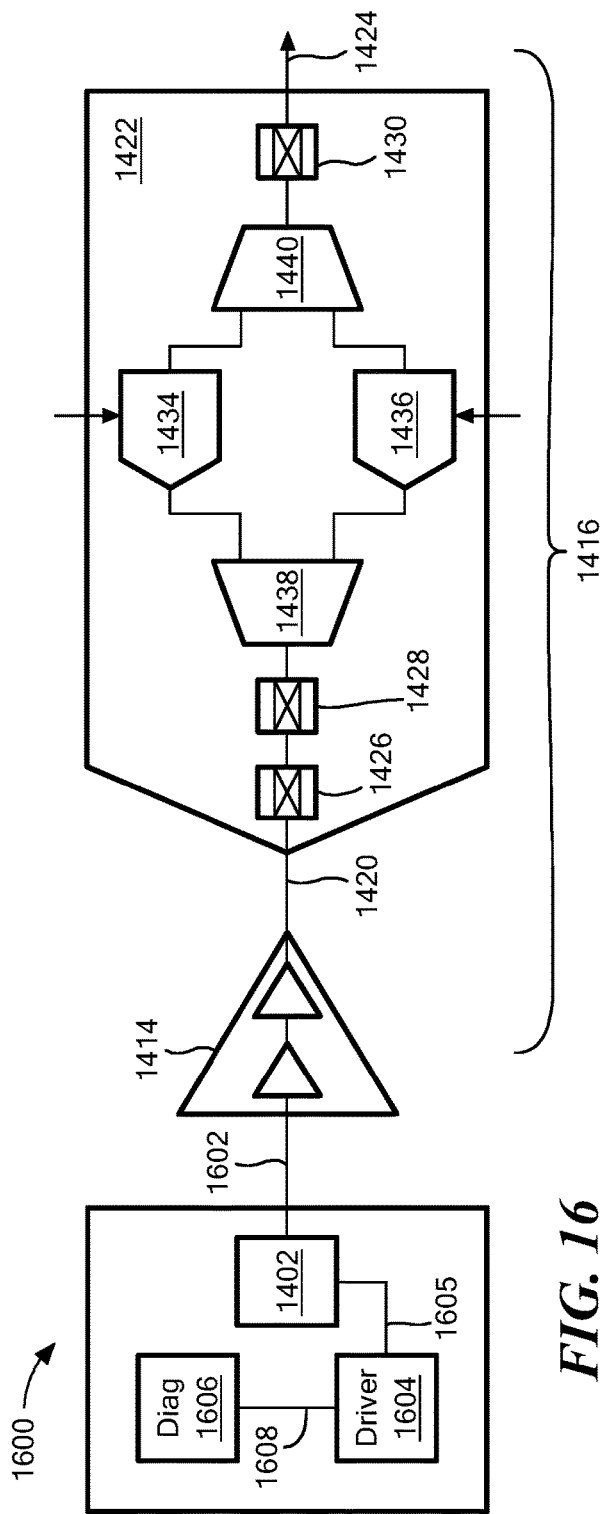
FIG. 16 is a block diagram of a magnetic field sensor including an amplifier, a dual-path analog-to-digital converter, and a diagnostic circuit.

Referring to FIG. 16, circuit 1600 be included in or as part of a magnetic field sensor system. Circuit 1600 may be configured to detect a magnetic field (such as magnetic field 106 in FIG. 1) and process signals representing the detected magnetic field. For example, magnetic field sensing element(s) 1402 may detect the magnetic field and produce signal 1602 representing the detected magnetic field.

A driver circuit 1604 may provide electrical power to magnetic field sensing element(s) 1402 by way of power signal 1605, which may allow magnetic field sensing element(s) 1402 to detect the external magnetic field and produce signal 1602. Driver circuit 1604 may be a variable driver circuit that can provide variable voltage and/or current to magnetic field sensing element(s) 1402. In embodiments, the value of diagnostic power signal 1605 may change depending on whether circuit 1600 is operating during the measured time period (i.e. the time period where circuit 1600 is measuring and processing the external magnetic field) or the diagnostic time period (i.e. the time period where circuit 1600 is processing a diagnostic or test signal). Power signal 1605 may provide normal power to magnetic field sensing element(s) 1402 during the measured time period, and may provide a diagnostic power signal to magnetic field sensing element(s) 1402 during the diagnostic time period.

During the measured time period, power signal 1605 may provide a normal power level to magnetic field sensing element(s) 1402 so that they can operate and sense the external magnetic field normally. In an embodiment, during the diagnostic time period, power signal 1605 may provide a low power level to magnetic field sensing element(s) 1402. The lower power signal may be sufficiently low so that that magnetic field sensing element(s) 1402 provide a nominal output, but are not able to sense and react to the external magnetic field. Under these circumstances, changes in the external magnetic field may not affect signal 1602 during the diagnostic time period. This may be beneficial when testing for errors in circuit 1600 because the signal 1602 may be predictable (e.g. have a known value) if it is not affected by a changing, external magnetic field.

Circuit 1600 may include a diagnostic circuit 1606 to generate a diagnostic control signal 1608. Diagnostic control signal 1608 may be a signal that controls driver circuit 1604 and causes driver circuit 1604 to provide a diagnostic power signal 1605. In this and similar embodiments, diagnostic control signal 1608 and/or diagnostic power signal 1605 may be considered diagnostic signals. Circuit 1400 may perform self-tests by, for example, processing diagnostic signal 1408 and comparing the processed signals to an expected value. The diagnostic signal may be a DC signal, a periodic signal, or any other signal that may produce an expected result when processed by circuit 1600.

Figure 17:
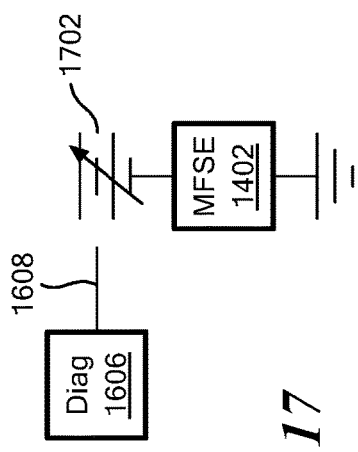
FIG. 17 is a circuit diagram of a diagnostic circuit, a variable power source, and a magnetic field sensing element.

Referring to FIG. 17, in an embodiment, diagnostic circuit 1606 may be coupled to a variable voltage source 1702 that provides power to magnetic field sensing element(s) 1402. Diagnostic control signal 1608 may control variable voltage source 1702 so that variable voltage source drives magnetic field sensing element(s) 1402 with a first voltage during the measured time period and with a second voltage during the diagnostic time period. In an embodiment, the second voltage is lower than the first voltage. One skilled in the art will recognize that variable voltage source 1702 may be replaced with a variable current source, a variable power source, a switch or multiplexor connected to multiple power sources having different power levels, or any other circuit that can switch or vary the power provided to magnetic field sensing element(s) 1402.

Elements of different embodiments described above may be combined to form other embodiments not specifically set forth above. Various elements, which are described in the context of a single embodiment, may also be provided separately or in any suitable subcombination. Other embodiments not specifically described herein are also within the scope of the following claims.

All references cited in this disclosure are incorporated here by reference in their entireties.

Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor comprising:
    at least one magnetic field sensing element configured to generate a measured magnetic field signal responsive to an external magnetic field;
    a diagnostic circuit configured to generate a diagnostic signal, wherein the diagnostic signal is not dependent on a measured magnetic field;
    a signal path comprising an amplifier and an analog-to-digital converter for processing the measured magnetic field signal to generate a sensor output signal indicative of the external magnetic field during a measured time period and for processing the diagnostic signal during a diagnostic time period, wherein the analog-to-digital converter is responsive to the measured magnetic field signal to generate a digital measure magnetic field signal and responsive to the diagnostic signal to generate a digital diagnostic signal, wherein the analog-to-digital converter comprises at least one integrator circuit having a first capacitor configured to process the measured magnetic field signal and a second capacitor configured to process the diagnostic signal;
    a controller configured to selectively couple the first capacitor to the signal path during the measured time period and couple the second capacitor to the signal path during the diagnostic time period; and
    a switch coupled to receive the measured magnetic field signal and the diagnostic signal and direct the measured magnetic field signal to the signal path during the measured time period and direct the diagnostic signal to the signal path during the diagnostic time period.

2. The magnetic field sensor of claim 1 further comprising a coil to generate the external magnetic field.

3. The magnetic field sensor of claim 1 wherein the diagnostic circuit is configured to generate the diagnostic signal during one of: the diagnostic time period, the measured time period, or both the diagnostic and measured time periods.

4. The magnetic field signal of claim 1 further comprising an output signal generator responsive to the measured magnetic field signal and to the diagnostic signal to generate the sensor output signal.

5. The magnetic field sensor of claim 1 wherein the at least one magnetic field sensing element comprises: a Hall effect element, a magnetoresistance element, or both.

6. A magnetic field sensor comprising:
    at least one magnetic field sensing element configured to generate a measured magnetic field signal responsive to an external magnetic field;
    a diagnostic circuit configured to generate a diagnostic signal;
    a signal path comprising a shared portion for processing the measured magnetic field signal to generate a sensor output signal indicative of the external magnetic field during a measured time period and for processing the diagnostic signal to determine whether a fault is present during a diagnostic time period, and a dedicated portion for processing the measured magnetic field signal during the measured time period;
    an analog-to-digital converter comprising at least one integrator and wherein the dedicated signal path portion comprises a first capacitor dedicated to processing the measured magnetic field signal and a second capacitor dedicated to processing the diagnostic signal; and
    a controller configured to enable the dedicated signal path portion to process the diagnostic signal and to selectively couple the first capacitor to the signal path during the measured time period and couple the second capacitor to the signal path during the diagnostic time period.

7. The magnetic field sensor of claim 6 wherein the diagnostic circuit is electrically coupled directly to the at least one magnetic field sensing element to direct the diagnostic signal to the at least one magnetic field sensing element.

8. The magnetic field sensor of claim 7 wherein the diagnostic signal is a power signal that drives the at least one magnetic field sensing element.

9. A magnetic field sensor comprising:
    at least one magnetic field sensing element configured to generate a measured magnetic field signal responsive to an external magnetic field;
    a diagnostic circuit configured to generate a diagnostic signal;
    a multiplexor coupled to receive the measured magnetic field signal and the diagnostic signal as inputs, and provide either the magnetic field signal or the diagnostic signal as an output;
    a signal processing path coupled to receive the output of the multiplexor and process the measured magnetic field signal to generate a sensor output signal indicative of the external magnetic field during a measured time period, and process the diagnostic signal to determine whether a fault is present during a non-overlapping diagnostic time period; and a control circuit coupled to the multiplexor and configured to cause the multiplexor to provide the measured magnetic field signal as the output during the measured time period, and provide the diagnostic signal as the output during the diagnostic time period, wherein the control circuit is configured to selectively couple a first ADC signal path to the signal processing path during the measured time period and selectively couple a second ADC signal path to the signal processing path during the diagnostic time period.

10. The magnetic field sensor of claim 9 wherein the at least one magnetic field sensing element is selected from a Hall effect element, a magnetoresistance element, or both.

11. The magnetic field sensor of claim 9 further comprising an analog-to-digital converter (ADC) responsive to the measured magnetic field signal to generate a digital measured magnetic field signal and responsive to the diagnostic signal to generate a digital diagnostic signal.

12. The magnetic field sensor of claim 11 wherein the ADC comprises the first ADC signal path for processing the measured magnetic field signal and the second ADC signal path for processing the diagnostic signal.

* * * * *

UNITED STATES PATENT AND TRADEMARK OFFICE
CERTIFICATE OF CORRECTION

PATENT NO. : 10,466,298 B2
APPLICATION NO. : 15/710136
DATED : November 5, 2019
INVENTOR(S) : Virag V. Chaware et al.

It is certified that error appears in the above-identified patent and that said Letters Patent is hereby corrected as shown below:

In the Drawings

Sheet 1 FIG. 1: reference numeral "165" should be --105--

Sheet 10 FIG. 11: replace all instances of "decimination" with --decimation--

Sheet 11 FIG 12: Replace "$k_{FE}$" with --$k_{TE}$--

In the Specification

Column 4, Line 10 delete "FIG." and replace with --FIG. 2.--.

Column 4, Line 21 delete "is block" and replace with --is a block--.

Column 6, Line 54 delete "hall" and replace with --Hall--.

Column 6, Line 59 delete ", though" and replace with --, through--.

Column 7, Line 1 delete "configured measure" and replace with --configured to measure--.

Column 7, Line 14 delete "predicable" and replace with --predictable--.

Column 8, Line 46 delete "236" and replace with --234--.

Column 10, Line 10 delete "106. I.e. with" and replace with --106, i.e., with--.

Column 11, Line 5 delete ", which the" and replace with --, with the--.

Column 11, Line 48 delete "only time" and replace with --only during time--.

Signed and Sealed this
Eighteenth Day of August, 2020

Andrei Iancu
*Director of the United States Patent and Trademark Office*

Column 12, Line 55 delete ", Integrator" and replace with --, integrator--.

Column 15, Line 1 delete "period and." and replace with --period.--.

Column 15, Line 40 delete "$C_{IN}$" and replace with --$V_{IN}$--.

Column 17, Line 34 delete "Receiver" and replace with --receiver--.

Column 19, Lines 23-24 delete "embodiment general," and replace with --embodiment,--.

Column 21, Line 12 delete "$\approx \frac{D_{NUM}}{1-(1-D_{DEN})}$," and replace with --$= \frac{D_{NUM}}{1(1-D_{DEN})}$--.

Column 22, Line 9 delete "to reference" and replace with --to a reference--.

Column 22, Line 13 delete "timer" and replace with --time--.

Column 22, Line 67 delete "converter 536," and replace with --converter 536)--.

Column 23, Line 8 delete "appreciated the" and replace with --appreciated that the--.

Column 23, Line 41 delete ", though which" and replace with --, through which--.

Column 24, Line 19 delete "signal 1404 and 1408." and replace with --signals 1404 and 1408.--.

Column 26, Line 28 delete "be included" and replace with --may be included--.

Column 26, Line 59 delete "so that that" and replace with --so that--.

Column 27, Line 17 delete "that variable" and replace with --that the variable--.

In the Claims

Column 27, Line 59 Claim 1 delete "measure" and replace with --measured--.